(12) United States Patent
Seo et al.

(10) Patent No.: US 11,367,854 B2
(45) Date of Patent: *Jun. 21, 2022

(54) DISPLAY DEVICE HAVING A BONDING FILAMENT AND METHOD OF MANUFACTURING THE SAME

(71) Applicant: SAMSUNG DISPLAY CO., LTD., Yongin-si (KR)

(72) Inventors: Woo Suk Seo, Yongin-si (KR); Eui Jeong Kang, Suwon-si (KR); Yong Hoon Kwon, Suwon-si (KR); Jung Hyun Kim, Suwon-si (KR); Si Joon Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 361 days.

This patent is subject to a terminal disclaimer.

(21) Appl. No.: 16/474,372

(22) PCT Filed: Dec. 27, 2018

(86) PCT No.: PCT/KR2018/016780
§ 371 (c)(1),
(2) Date: Jun. 27, 2019

(87) PCT Pub. No.: WO2019/198907
PCT Pub. Date: Oct. 17, 2019

(65) Prior Publication Data
US 2021/0336195 A1 Oct. 28, 2021

(30) Foreign Application Priority Data
Apr. 13, 2018 (KR) ........................ 10-2018-0043357

(51) Int. Cl.
*H01L 51/52* (2006.01)
*H01L 25/18* (2006.01)
(Continued)

(52) U.S. Cl.
CPC .......... *H01L 51/5246* (2013.01); *H01L 25/18* (2013.01); *H01L 51/56* (2013.01); *H01L 27/3258* (2013.01); *H01L 2227/323* (2013.01)

(58) Field of Classification Search
CPC ...... H01L 51/5246; H01L 33/48; H05B 33/04
See application file for complete search history.

(56) References Cited

U.S. PATENT DOCUMENTS 9,214,643 B2 12/2015 Yamazaki et al.
9,761,827 B2 9/2017 Yamazaki et al.
(Continued)

FOREIGN PATENT DOCUMENTS

EP 3 486 963 11/2018
JP 2012104397 5/2012
(Continued)

*Primary Examiner* — David A Zarneke
(74) *Attorney, Agent, or Firm* — F. Chau & Associats, LLC

(57) ABSTRACT

Provided are a display device and a method of manufacturing a display device. The display device includes a first substrate in which a display area and a non-display area disposed outside the display area are defined; a second substrate which faces the first substrate and comprises an area recessed in a thickness direction and a contact area disposed outside the recessed area; and a cell seal which bonds the first substrate and the second substrate together, wherein the cell seal comprises a bonding filament which is disposed between the contact area and the non-display area to connect the contact area and the first substrate and a frit seal which is disposed between the recessed area and the non-display area.

16 Claims, 23 Drawing Sheets

(51) Int. Cl.
*H01L 51/56* (2006.01)
*H01L 27/32* (2006.01)

(56) References Cited

U.S. PATENT DOCUMENTS

| | | |
|---|---|---|
| 10,741,630 B2* | 8/2020 | Seo ..................... H01L 51/5203 |
| 11,075,259 B2* | 7/2021 | Seo ..................... H01L 51/5246 |
| 2013/0134397 A1 | 5/2013 | Yamazaki et al. |
| 2021/0327999 A1 | 10/2021 | Seo et al. |

FOREIGN PATENT DOCUMENTS

| | | |
|---|---|---|
| KR | 10-2013-0094308 | 8/2013 |
| KR | 10-2019-0055860 | 5/2019 |

* cited by examiner

DISPLAY DEVICE HAVING A BONDING FILAMENT AND METHOD OF MANUFACTURING THE SAME

TECHNICAL FIELD

The present disclosure relates to a display device and a method of manufacturing the same.

BACKGROUND ART

With the development of multimedia, display devices are becoming increasingly important. Accordingly, various display devices such as liquid crystal displays and organic light emitting diode displays are being developed.

Display devices such as liquid crystal displays and organic light emitting diode displays may display images due to transmission of light. In particular, the transmittance of light may affect the display quality (e.g., luminance) of a display device. Thus, a display device may at least partially include a transparent element, for example, a glass element.

To form a multi-stack structure by bonding a plurality of transparent members, a bonding method using a sealant which is a liquid or ointment-type adhesive or a bonding method using a glass frit or powdered glass may be utilized.

In the sealant bonding, a first glass member and a second glass member may be bonded to each other by applying a liquid or ointment-type sealant material between the first glass member and the second glass member and then curing the sealant material.

In the glass frit/powdered glass bonding, the first glass member and the second glass member may be bonded to each other by applying a glass frit/powdered glass material between the first glass member and the second glass member and then melting and curing the glass frit/powdered glass material.

DISCLOSURE

Technical Problem

Aspects of the present disclosure provide a display device in which the area occupied by a cell seal is reduced.

Aspects of the present disclosure also provide a display device with improved bonding strength.

Aspects of the present disclosure also provide a method of manufacturing a display device in which the area occupied by a cell seal is reduced.

Aspects of the present disclosure also provide a method of manufacturing a display device with improved bonding strength.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Technical Solution

According to an aspect of the present disclosure, there is provided a display device including: a first substrate in which a display area and a non-display area disposed outside the display area are defined; a second substrate which faces the first substrate and includes an area recessed in a thickness direction and a contact area disposed outside the recessed area; and a cell seal which bonds the first substrate and the second substrate together, wherein the cell seal includes a bonding filament which is disposed between the contact area and the non-display area to connect the contact area and the first substrate and a frit seal which is disposed between the recessed area and the non-display area.

In addition, the display device may further include a first driver integrated circuit which is disposed in the non-display area, wherein the fit seal may be disposed between the display area and the first driver integrated circuit.

In addition, the contact area may have a width of about 50 μm to about 300 μm.

In addition, the bonding filament may at least partially overlap the contact area.

In addition, the bonding filament may have a width of about 10 μm to about 300 μm.

In addition, the second substrate may further include inner sidewalls which connect the recessed area and the contact area, wherein an opening may be defined by the inner sidewalls, the recessed area and the first substrate, and the frit seal may fill the opening.

In addition, the display device may further include a middle area which is disposed between the recessed area and the contact area and has a different refractive index from that of the recessed area.

In addition, the middle area may have a width of about 5 μm to about 30 μm.

In addition, the non-display area may include an upper non-display area disposed on an upper side of the display area, a lower non-display area disposed on a lower side of the display area, a left non-display area disposed on a left side of the display area, and a right non-display area disposed on a right side of the display area.

In addition, the bonding filament may be disposed over the upper non-display area, the left non-display area and the right non-display area, and the frit seal may be disposed in the lower non-display area.

In addition, the display device may further include a first driver integrated circuit disposed in the upper non-display area and a second driver integrated circuit disposed in the lower non-display area, wherein the frit seal may include a first sub-frit seal and a second sub-frit seal, wherein the first sub-frit seal may be disposed between the first driver integrated circuit and the display area, and the second sub-frit seal may be disposed between the second driver integrated circuit and the display area.

In addition, the bonding filament may include a first sub-bonding filament and a second sub-bonding filament, wherein the first sub-bonding filament may be disposed in the left non-display area, and the second sub-bonding filament may be disposed in the right non-display area.

In addition, the bonding filament may include a central portion and a peripheral portion disposed outside the central portion, wherein the central portion and the peripheral portion may have different refractive indices.

In addition, the display device may further include one or more insulating films which are disposed on the first substrate, wherein the bonding filament may pass through the insulating films to connect the contact area and the first substrate.

In addition, a distance from a surface of the contact area to a surface of the recessed area may be greater than or equal to a height of an organic light emitting diode.

According to another aspect of the present disclosure, there is provided a method of manufacturing a display device. The method includes: preparing a first substrate in which a display area and a non-display area disposed outside the display area are defined and a second substrate which faces the first substrate; applying a frit onto the first substrate or the second substrate to overlap the non-display area of the first substrate; forming a recessed area and a contact area disposed outside the recessed area by recessing a part of the second substrate in a thickness direction; forming a bonding filament for connecting the contact area and the first substrate by irradiating a laser beam in a state where the contact area and the first substrate are in contact with each other; and forming a frit seal by curing the frit.

In addition, the laser beam may be a femtosecond laser beam having a pulse width of about 200 femtoseconds to about 500 femtoseconds.

In addition, a focus of the laser beam may be set inside the first substrate, and a depth of focus may be about −100 μm to less than about 0 μm.

In addition, the focus of the laser beam may be set inside the second substrate, and the depth of focus may be about 0 μm to less than about 100 μm.

In addition, one or more insulating films may be formed on the first substrate, and the method may further include removing the insulating films, wherein the contact area may contact a part of the first substrate from which the insulating films have been removed.

The details of other embodiments are included in the detailed description and the drawings.

Advantageous Effects

According to aspects of the present disclosure, the area occupied by a cell seal is reduced. Thus, a display device having a narrow bezel can be implemented.

In addition, a display device with improved bonding strength between a upper substrate and a lower substrate can be implemented.

The effects according to the present invention are not limited by the contents exemplified above, and more various effects are included in the specification.

MODE FOR INVENTION

Figure 1:
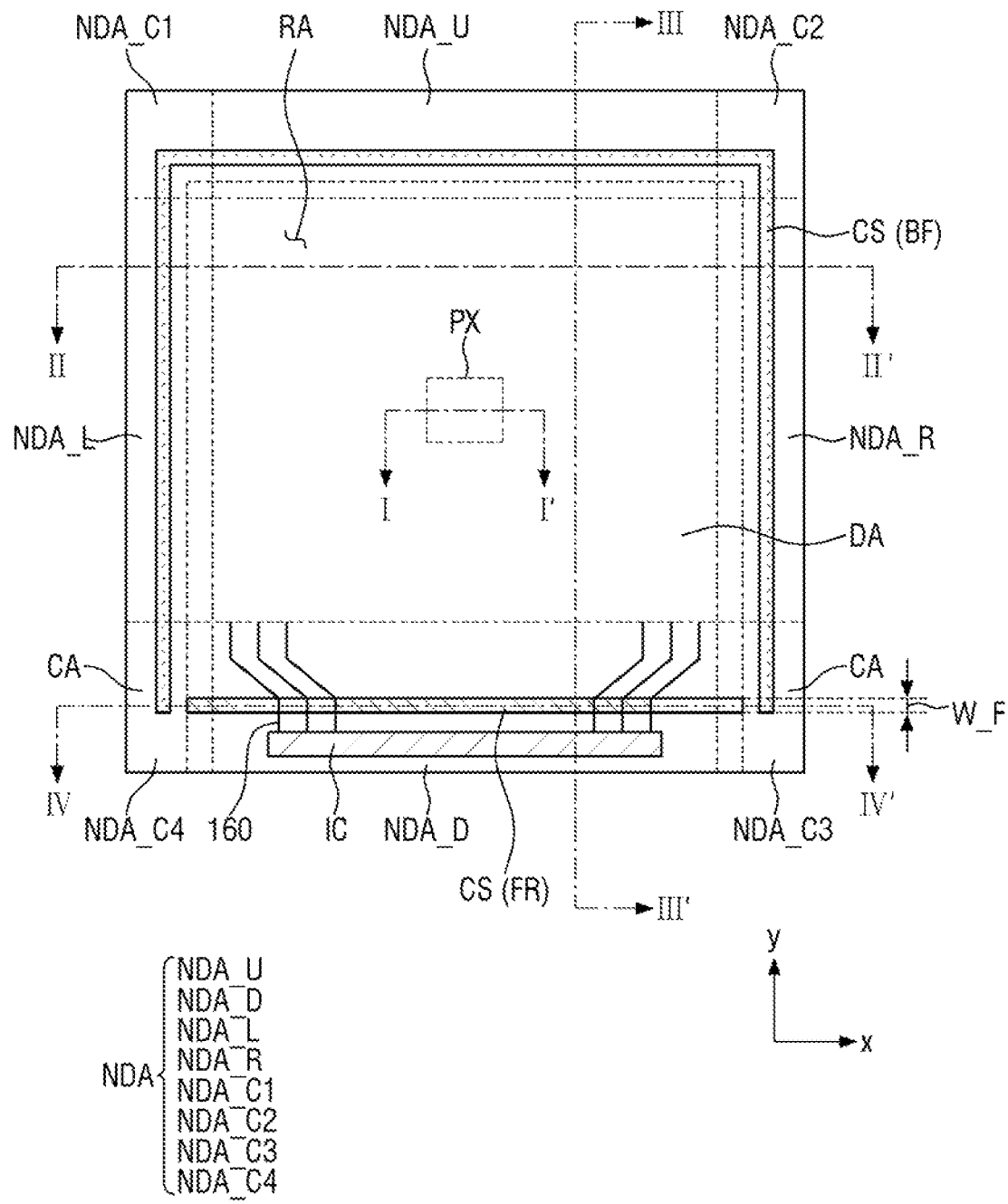
FIG. 1 is a layout view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described with reference to the attached drawings.

Figure 2:
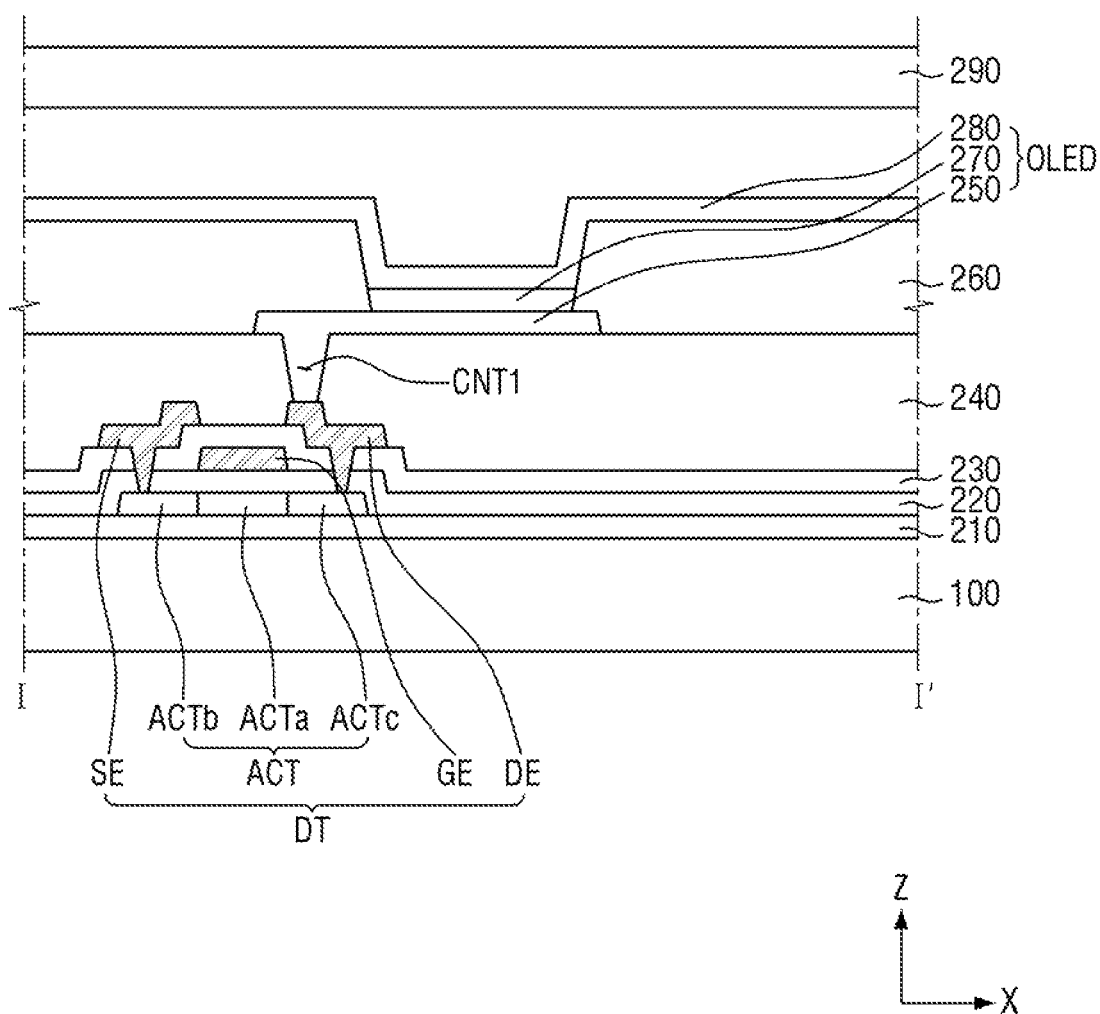
FIG. 2 is a cross-sectional view taken along line I-I' of FIG. 1.
Figure 3:
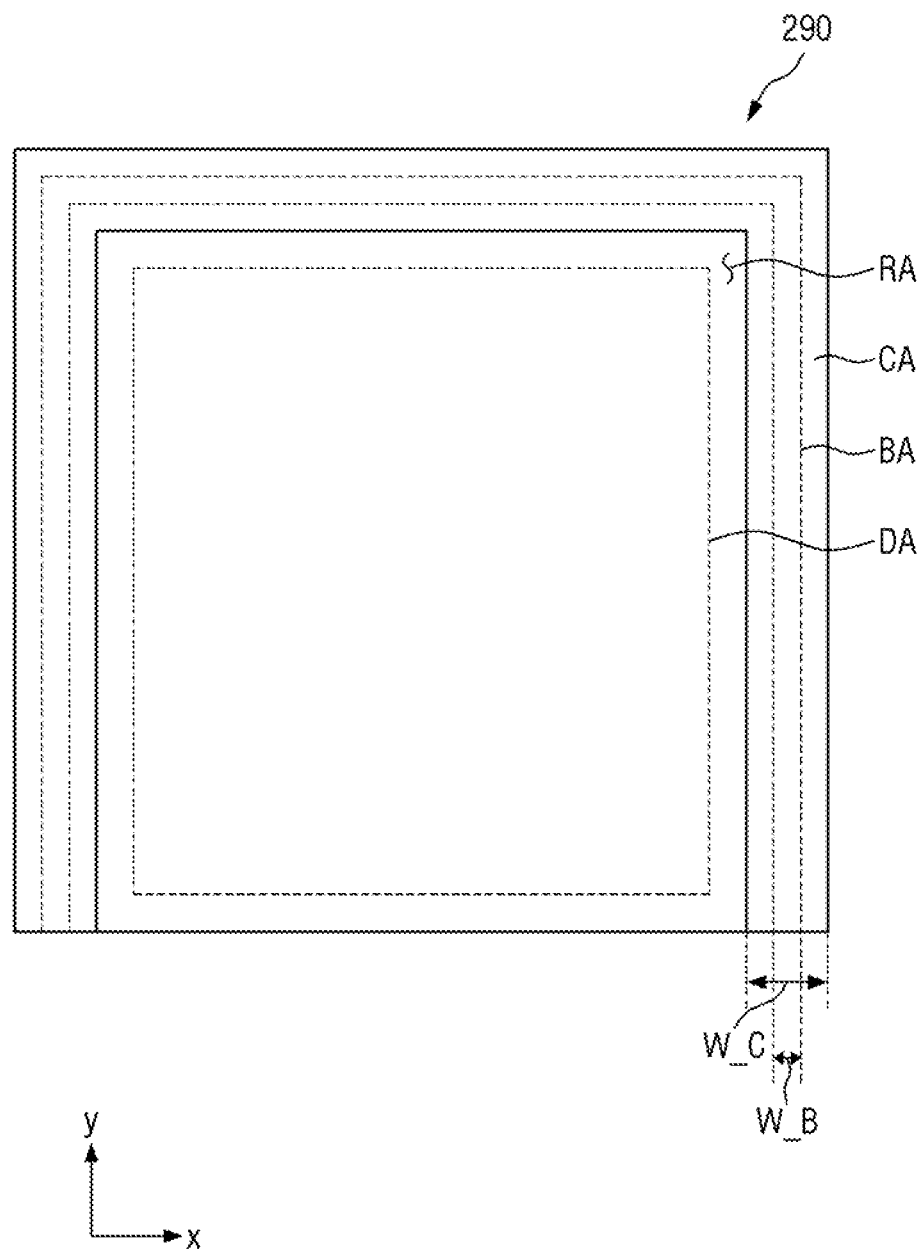
FIG. 3 is a partial plan view of the display device of FIG. 1.
Figure 4:
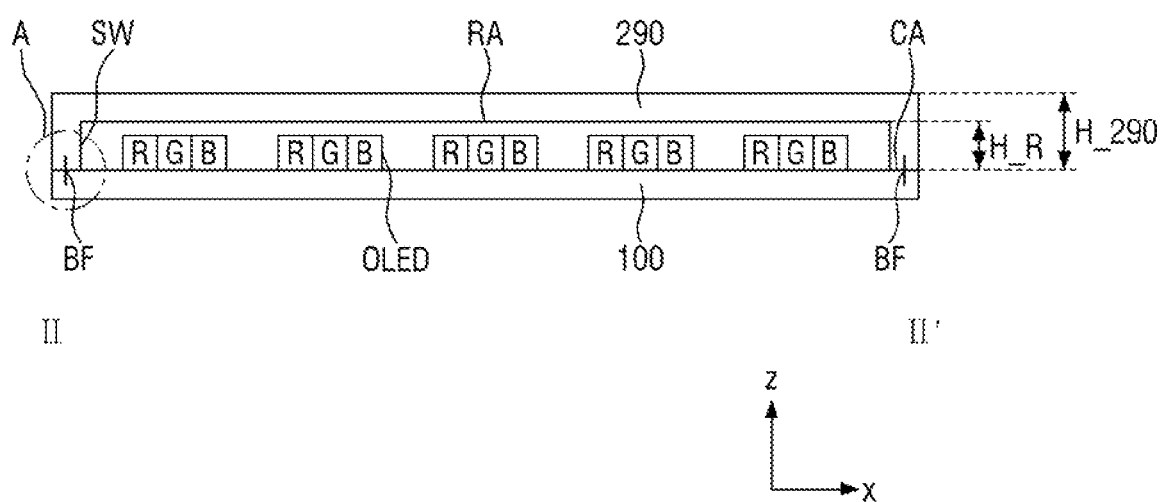
FIG. 4 is a cross-sectional view taken along line II-II' of FIG. 1.
Figure 5:
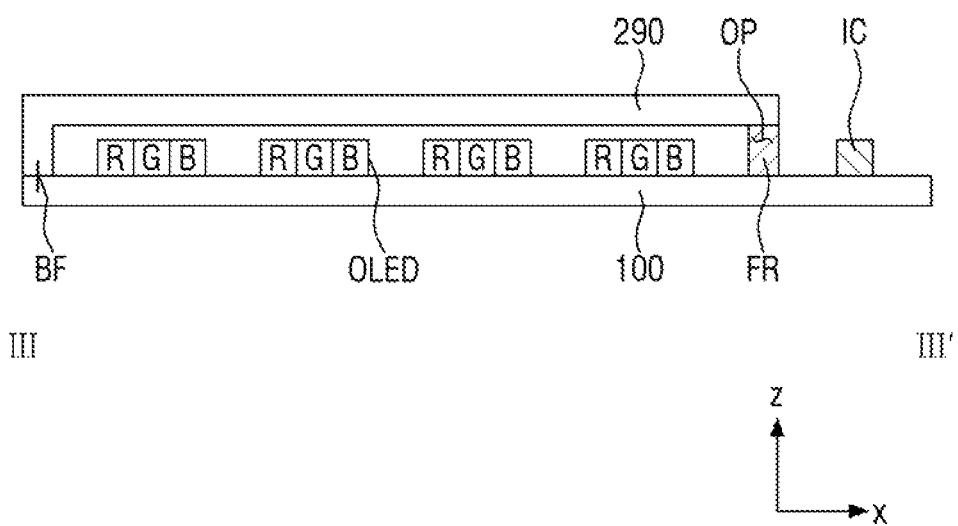
FIG. 5 is a cross-sectional view taken along line of FIG. 1.
Figure 6:
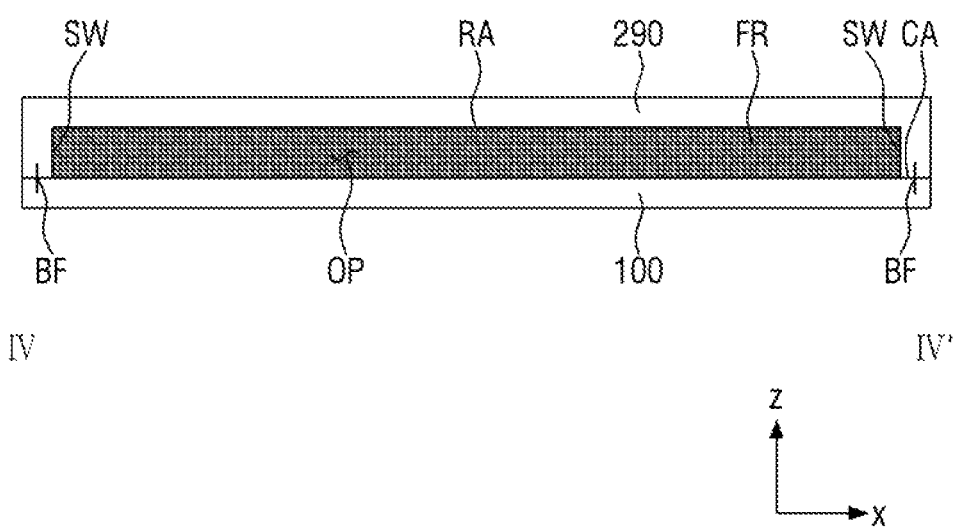
FIG. 6 is a cross-sectional view taken along line IV-IV' of FIG. 1.

FIG. 1 is a layout view of a display device according to an embodiment. FIG. 2 is a cross-sectional view taken along line I-I' of FIG. 1. FIG. 3 is a partial plan view of the display device of FIG. 1. FIG. 4 is a cross-sectional view taken along line II-II' of FIG. 1. FIG. 5 is a cross-sectional view taken along line III-III' of FIG. 1. FIG. 6 is a cross-sectional view taken along line IV-IV' of FIG. 1.

Referring to FIGS. 1 through 6, the display device according to the embodiment includes a first substrate 100, a second substrate 290, and a cell seal CS.

In an embodiment, the first substrate 100 may include a material such as glass, quartz, or polymer resin. Here, the polymer material may be polyethersulphone (PES), polyacrylate (PA), polyarylate (PAR), polyetherimide (PEI), polyethylene naphthalate (PEN), polyethylene terephtalate (PET), polyphenylene sulfide (PPS), polyallylate, polyimide (PI), polycarbonate (PC), cellulose triacetate (CAT), cellulose acetate propionate (CAP), or a combination of these materials.

The first substrate 100 may include a display area DA and a non-display area NDA.

The display area DA is defined as an area that displays an image. A plurality of pixels PX for realizing an image may be disposed in the display area DA.

The non-display area NDA is disposed outside the display area DA and defined as an area that does not display an image. The non-display area NDA may surround the display area DA in an embodiment. In FIG. 1, the non-display area NDA surrounds the display area DA. However, the present disclosure is not limited to this case. In an embodiment, the non-display area NDA may be disposed adjacent to only a side or the other side of the display area DA or may be disposed on each of both sides of the display area DA.

For ease of description, different parts of the non-display area NDA will be referred to by different terms. In an embodiment, the non-display area NDA may include an upper non-display area NDA_U disposed on an upper side of the display area DA in FIG. 1, a lower non-display area NDA_D disposed on a lower side of the display area DA, a left non-display area NDA_L disposed on a left side of the display area DA, and a right non-display area NDA_R disposed on a right side of the display area DA. In addition, the non-display area NDA may include a first corner non-display area NDA_C1, a second corner non-display area NDA_C2, a third corner non-display area NDA_C3, and a fourth corner non-display area NDA_C4 disposed at four corners, respectively.

In an embodiment, a driver integrated circuit IC may be disposed in the non-display area NDA. In FIG. 1, a case where the driver integrated circuit IC is disposed in the lower non-display area NDA_D is illustrated as an example.

The driver integrated circuit IC may generate signals necessary for driving the display area DA and transmit the generated signals to the display area DA.

A plurality of first conductive lines 160 may be disposed between the driver integrated circuit IC and the display area DA. The first conductive lines 160 may electrically connect the driver integrated circuit IC and the display area DA. That is, signals generated by the driver integrated circuit IC may be transmitted to the display area DA via the conductive lines 160.

As described above, a plurality of pixels PX may be arranged in the display area DA. A stacked structure of a portion where a pixel PX is formed in the display device according to the embodiment will now be described with reference to FIG. 2.

A buffer layer 210 may be disposed on the first substrate 100. The buffer layer 210 may prevent the penetration of moisture and oxygen from the outside through the first substrate 100. In addition, the buffer layer 210 may planarize the surface of the first substrate 100. In an embodiment, the buffer layer 210 may include any one of a silicon nitride (SiNx) film, a silicon oxide ($SiO_2$) film, and a silicon oxynitride (SiOxNy) film. The buffer layer 210 can be omitted depending on the type of the first substrate 100 or process conditions.

A semiconductor layer including a semiconductor pattern ACT may be disposed on the buffer layer 210. The semiconductor layer will be described based on the semiconductor pattern ACT. In an embodiment, the semiconductor pattern ACT may be made of one of or a mixture of two or more of polycrystalline silicon, monocrystalline silicon, low temperature polycrystalline silicon, amorphous silicon, and an oxide semiconductor. The semiconductor pattern ACT may include, in an embodiment, a channel region ACTa not doped with an impurity and a source region ACTb and a drain region ACTc doped with an impurity. The source region ACTb is located on a side of the channel region ACTa and is electrically connected to a source electrode SE to be described later. The drain region ACTc is located on the other side of the channel region ACTa and is electrically connected to a drain electrode DE to be described later.

A first insulating layer 220 may be disposed on the semiconductor layer including the semiconductor pattern ACT. The first insulating layer 220 may be a gate insulating layer in an embodiment. In an embodiment, the first insulating layer 220 may be made of any one or a mixture of one or more of inorganic insulating materials such as silicon oxide (SiOx) and silicon nitride (SiNx) and organic insulating materials such as benzocyclobutene (BCB), acrylic materials and polyimide.

A gate conductor including a gate electrode GE may be disposed on the first insulating layer 220. The gate electrode GE may overlap the semiconductor pattern ACT. The gate conductor may include any one or more of aluminum (Al)-based metal including aluminum alloys, silver (Ag)-based metal including silver alloys, copper (Cu)-based metal including copper alloys, molybdenum (Mo)-based metal including molybdenum alloys, chromium (Cr), titanium (Ti), and tantalum (Ta).

A second insulating layer 230 may be disposed on the gate conductor including the gate electrode GE. The second insulating layer 230 may be made of any one or a mixture of one or more of inorganic insulating materials such as silicon oxide (SiOx) and silicon nitride (SiNx) and organic insulating materials such as benzocyclobutene (BCB), acrylic materials and polyimide.

A data conductor including the source electrode SE and the drain electrode DE may be disposed on the second insulating layer 230. The source electrode SE and the drain electrode DE are disposed on the second insulating layer 230 to be spaced apart from each other. The data conductor may include one or more of a metal, an alloy, a metal nitride, a conductive metal oxide, and a transparent conductive material. In an embodiment, the data conductor may have a single film structure or a multi-film structure composed of one or more of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), and tantalum (Ta). In addition, the source electrode SE and the drain electrode DE may be made of an alloy of any one of the above metals and one or more elements selected from titanium (Ti), zirconium (Zr), tungsten (W), tantalum (Ta), niobium (Nb), platinum (Pt), hafnium (Hf), oxygen (O) and nitrogen (N).

The semiconductor pattern ACT, the gate electrode GE, the source electrode SE and the drain electrode DE described above constitute a switching element DT. In FIG. 2, the switching element DT is illustrated as a top gate type. However, the switching element DT is not limited to the top gate type. That is, the switching element DT can be formed as a bottom gate type.

A planarization layer 240 may be disposed on the data conductor. The planarization layer 240 may remove steps, thereby increasing the luminous efficiency of a pixel electrode 250 and an organic light emitting layer 270 which will be described later. The planarization layer 240 may include an organic material in an embodiment. For example, the planarization layer 240 may include any one or more of polyimide, polyacryl, and polysiloxane. In an embodiment, the planarization layer 240 may include an inorganic material or a composite of an inorganic material and an organic material. A first contact hole CNT1 may be formed in the planarization layer 240 to expose at least a part of the drain electrode DE.

The pixel electrode 250 may be disposed on the planarization layer 240. The pixel electrode 250 may be electrically connected to the drain electrode DE exposed by the first contact hole CNT1. That is, the pixel electrode 250 may be an anode which is a hole injection electrode. When formed as an anode, the pixel electrode 250 may include a material having a high work function in order to facilitate hole injection. In addition, the pixel electrode 250 may be a reflective electrode, a transflective electrode, or a transmissive electrode. The pixel electrode 250 may include a reflective material in an embodiment. In an embodiment, the reflective material may include one or more of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

The pixel electrode 250 may be formed as a single film in an embodiment. Alternatively, the pixel electrode 250 may be formed as a multi-film in which two or more materials are stacked.

When formed as a multi-film, the pixel electrode 250 may include, in an embodiment, a reflective film and a transparent or translucent electrode disposed on the reflective film. In an embodiment, the pixel electrode 250 may include a reflective film and a transparent or translucent electrode disposed under the reflective film. For example, the pixel electrode 250 may have a three-layer structure of ITO/Ag/ITO.

Here, the transparent or translucent electrode may be made of one or more of indium tin oxide (ITO), indium zinc oxide (IZO), zinc oxide (ZnO), indium oxide ($In_2O_3$), indium gallium oxide (IGO), and aluminum zinc oxide (AZO).

A pixel defining layer 260 may be disposed on the pixel electrode 250. The pixel defining layer 260 includes an opening that at least partially exposes the pixel electrode 250. The pixel defining layer 260 may include an organic material or an inorganic material. In an embodiment, the pixel defining layer 260 may include a material such as photoresist, polyimide resin, acrylic resin, a silicon compound, or polyacrylic resin.

The organic light emitting layer 270 may be disposed on the pixel electrode 250 and the pixel defining layer 260. More specifically, the organic light emitting layer 270 may be disposed on a region of the pixel electrode 250 which is exposed through the opening of the pixel defining layer 260. In an embodiment, the organic light emitting layer 270 may at least partially cover sidewalls of the pixel defining layer 260.

In an embodiment, the organic light emitting layer 270 may emit light of one of red, blue and green colors. In an embodiment, the organic light emitting layer 270 may emit white light or emit light of one of cyan, magenta and yellow colors. When the organic light emitting layer 270 emits white light, it may include a white light emitting material or may have a stack of a red light emitting layer, a green light emitting layer and a blue light emitting layer.

A common electrode 280 may be disposed on the organic light emitting layer 270 and the pixel defining layer 260. The common electrode 280 may be formed on the entire surface of the organic light emitting layer 270 and the pixel defining layer 260 in an embodiment. The common electrode 280 may be a cathode in an embodiment. In an embodiment, the common electrode 280 may include one or more of Li. Ca, Lif/Ca, LiF/Al, Al, Ag, and Mg. In addition, the common electrode 280 may be made of a material having a low work function. The common electrode 280 may be, in an embodiment, a transparent or translucent electrode including any one or more of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode 250, the organic light emitting layer 270 and the common electrode 280 described above may constitute an organic light emitting diode OLED. However, the organic light emitting diode OLED is not limited to this configuration and may be a multilayer structure further including a hole injection layer (HIL), a hole transport layer (HTL), an electron transport layer (ETL), and an electron injection layer (EIL).

The second substrate 290 may be bonded to the first substrate 100 by the cell seal CS. The cell seal CS will be described in detail later.

The second substrate 290 may be a transparent insulating substrate in an embodiment. When the second substrate 290 is a transparent insulating substrate, the transparent insulating substrate may be a glass substrate, a quartz substrate, a transparent resin substrate, or the like.

Referring to FIG. 3, the second substrate 290 may include a recessed area RA and a contact area CA.

FIG. 3 illustrates a back side of the second substrate 290. In an embodiment, the recessed area RA may be an area of the second substrate 290 which is recessed in a thickness direction. Here, the thickness direction may be a z-axis direction.

The contact area CA may be defined as an area of the second substrate 290 which contacts the first substrate 100 or an insulating film disposed on the first substrate 100.

The contact area CA may be an area other than the recessed area RA. While the recessed area RA is an area recessed in the thickness direction, the contact area CA may be a non-recessed area.

In an embodiment, the contact area CA may at least partially surround the recessed area RA. In FIG. 3, a case where the contact area CA covers three sides of the recessed area RA is illustrated as an example. The contact area CA and the recessed area RA may be flat surfaces parallel to each other but may be at different levels. In this specification, when two flat surfaces are "at different levels," it means that the two flat surfaces are parallel but different in height. Since the two flat surfaces are different in height, the second substrate 290 may include inner sidewalls SW connecting ends of the contact area CA and ends of the recessed area RA (see FIG. 4, etc.).

Referring again to FIG. 3, the contact area CA may have a "U" shape in an embodiment. In this case, three sides of the recessed area RA may be covered by the contact area CA, but one side of the recessed area RA may be open without being covered by the contact area CA. That is, an opening OP that is not closed by the contact area CA may be formed between the first substrate 100 and the second substrate 290 in a state where the first substrate 100 and the second substrate 290 are in contact with each other. The opening OP may be sealed by a frit seal FR, as will be described in detail later.

The second substrate 290 may have different thicknesses in the contact area CA and the recessed area RA. In other words, since the contact area CA is an area that is not recessed, the thickness of the second substrate 290 may be larger in the contact area CA than in the recessed area RA.

In an embodiment, the recessed area RA may correspond to the display area DA. Specifically, the display area DA may be completely overlapped by the recessed area RA. That is, the recessed area RA may completely accommodate the display area DA. To this end, the planar area of the recessed area RA may be greater than or equal to that of the display area DA.

A bonding area BA may be formed in the contact area CA. The bonding area BA may be an area where a bonding filament BF to be described later is to be formed. In an embodiment, the bonding area BA may be disposed along the contact area CA. That is, the area where the bonding filament BF is formed may completely overlap the contact area CA.

In an embodiment, a width W_C of the contact area CA may be about 50 μm to about 300 μm. In an embodiment, the bonding area BA may completely overlap the contact area CA. That is, the bonding area BA may be formed inside the contact area CA.

In an embodiment, a width W_B of the bonding area BA may be about 10 μm to about 300 μm. For stable bonding, the width W_C of the contact area CA may be greater than or equal to the width W_B of the bonding area BA.

The cell seal CS will now be described with reference to FIG. 1 again. The cell seal CS may bond the first substrate 100 and the second substrate 290 together. In addition, the cell seal CS may encapsulate the display area DA. That is, when the first substrate 100 and the second substrate 290 are sealed by the cell seal CS, moisture, oxygen, or foreign matter cannot penetrate into the display area DA.

In an embodiment, the cell seal CS may include the bonding filament BF and the frit seal FR.

In an embodiment, the bonding filament BF may at least partially surround the display area DA. In an embodiment, the bonding filament BF may be formed over the left non-display area NDA_L, the first corner non-display area NDA_C1, the upper non-display area NDA_U, the second corner non-display area NDA_C2, and the right non-display area NDA_R.

In an embodiment, the bonding filament BF is continuously formed to seal three sides of the display area DA. Specifically, the bonding filament BF is interposed between the contact area CA of the second substrate 290 and the left non-display area NDA_L, the first corner non-display area NDA_C1, the upper non-display area NDA_U, the second corner non-display area NDA_C2 and the right non-display area NDA_R to bond the first substrate 100 and the second substrate 290 together.

In an embodiment, the bonding filament BF may consist of a plurality of sub-bonding filaments. That is, referring to FIG. 22, the bonding filament BF may include a first sub-bonding filament BF_1 extending in a y-axis direction along the left non-display area NDA_L, a second sub-bonding filament BF_2 extending in the y-axis direction along the right non-display area NDA_R, and a third sub-bonding filament BF_3 extending in an x-axis direction along the upper non-display area NDA_U.

Here, the first sub-bonding filament BF_1 and the third sub-bonding filament BF_3 may extend to the first corner non-display area NDA_C1. In this case, a first intersection point 310 where the first sub-bonding filament BF_1 and the third sub-bonding filament BF_3 cross may be formed in the first corner non-display area NDA_C1. In an embodiment, the first sub-bonding filament BF_1 and the third sub-bonding filament BF_3 may extend further in a longitudinal direction beyond the first intersection point 310.

Similarly, the second sub-bonding filament BF_2 and the third sub-bonding filament BF_3 may extend to the second corner non-display area NDA_C2.

In this case, a second intersection point 320 where the second sub-bonding filament BF_2 and the third sub-bonding filament BF_3 cross may be formed in the second corner non-display area NDA_C2. In an embodiment, the second sub-bonding filament BF_2 and the third sub-bonding filament BF_3 may extend further in the longitudinal direction beyond the second intersection point 320.

FIG. 4 is a cross-sectional view taken along line II-II' of FIG. 1. Referring to FIG. 4, left and right sides of a plurality of organic light emitting diodes OLED disposed on the first substrate 100 may be closed by the second substrate 290.

The contact area CA may contact the first substrate 100 as illustrated in FIG. 4. In the present specification, when "the contact area CA contacts the first substrate 100," it can be understood that the contact area CA directly contacts the first substrate 100 or that the contact area CA contacts an insulating film formed on the first substrate 100. This will be described in detail later.

A height H_290 of the second substrate 290 may be defined. The height H_290 of the second substrate 290 may be defined as a height from a contact surface of the contact area CA to an upper surface of the second substrate 290. In an embodiment, the height H_290 of the second substrate 290 may be about 0.3 mm to about 0.5 mm.

In addition, a height H_R of the recessed area RA may be defined. The height H_R of the recessed area RA may indicate the degree to which the recessed area RA is recessed from the second substrate 290 and indicate a distance from the surface of the contact area CA to a surface of the recessed area RA. In an embodiment, the height H_R of the recessed area RA may be about 5 μm to about 100 μm.

In an embodiment, the height H_R of the recessed area RA may be greater than or equal to a height of the organic light emitting diodes OLED. Here, "the height of the organic light emitting diodes OLED" may denote a height of a highest portion of an area where the organic light emitting diodes OLED are formed.

Accordingly, the surface of the recessed area RA may be in contact with or spaced apart from the organic light emitting diodes OLED.

Due to this difference in height between the contact area CA and the recess area RA, the inner sidewalls SW connecting the ends of the contact area CA and the recessed area RA may be formed. The inner sidewalls SW may extend in the z-axis direction as illustrated in FIG. 4. However, the present disclosure is not limited to this case, and the inner sidewalls SW may also include at least partially inclined surfaces.

Referring again to FIG. 1, the cell seal CS may include the frit seal FR. In an embodiment, the frit seal FR may be disposed in the lower non-display area NDA_D. In addition, both ends of the fit seal FR may extend to the third corner non-display area NDA_C3 and the fourth corner non-display area NDA_C4. That is, the fit seal FR may have a bar shape extending along the longitudinal direction (the x-axis direction in FIG. 1) in the lower non-display area NDA_D, the third corner non-display area NDA_C3 and the fourth corner non-display area NDA_C4. In addition, the fit seal FR may be disposed between the driver integrated circuit IC and the display area DA. Accordingly, the first conductive lines 160 may at least partially overlap the frit seal FR.

The frit seal FR may include a plurality of fits. In other words, the frit seal FR may be a result of melting a plurality of frits.

The frit seal FR may be disposed between the recessed area RA and the lower non-display area NDA_D, the third corner non-display area NDA_C3 and the fourth corner non-display area NDA_C4. That is, the fit seal FR may be disposed between the non-display area NDA and the recessed area RA to bond the first substrate 100 and the second substrate 290 together.

In an embodiment, a width W_F of the frit seal FR may be about 590 μm to about 610 μm.

FIG. 5 is a cross-sectional view taken along line III-III' of FIG. 1. FIG. 6 is a cross-sectional view taken along line IV-IV' of FIG. 1. Referring to FIGS. 5 and 6, the opening OP may be formed between the first substrate 100 and the second substrate 290 at a portion adjacent to the driver integrated circuit IC, as described above. In an embodiment, the opening OP may be completely sealed by the fit seal FR as illustrated in FIG. 6.

That is, as illustrated in FIG. 6, the opening OP, which is a space defined by the inner sidewalls SW, the recessed area RA and the first substrate 100, is completely filled with the frit seal FR.

When the opening OP is completely sealed by the frit seal FR, the organic light emitting diodes OLED disposed on the first substrate 100 may be completely encapsulated by the cell seal CS, that is, the bonding filament BF and the frit seal FR.

The bonding filament BF will now be described in detail with reference to FIG. 7.

Figure 7:
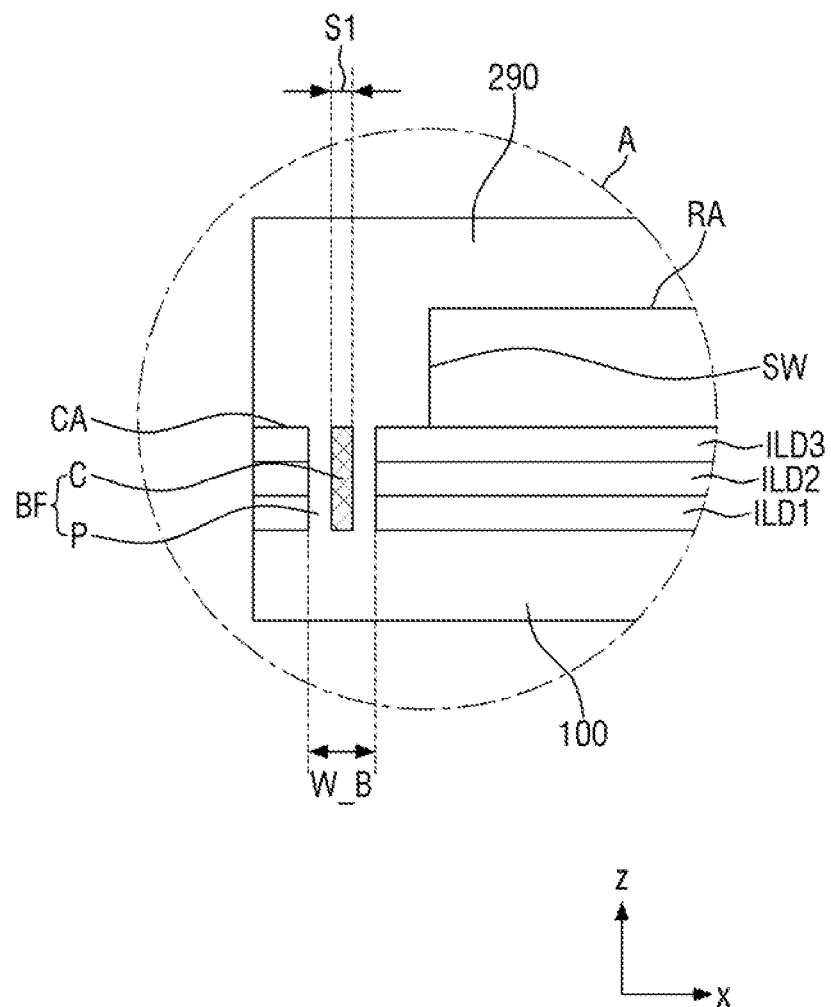
FIG. 7 is an enlarged view of a portion 'A' of FIG. 4.

FIG. 7 is an enlarged view of a portion 'A' of FIG. 4.

Referring to FIG. 7, the bonding filament BF may be disposed between the contact area CA and the first substrate 100. Specifically, the bonding filament BF may physically connect the first substrate 100 and the second substrate 290 in the contact area CA.

In cross-section, the bonding filament BF may extend in the z-axis direction. In addition, the bonding filament BF may extend in the z-axis direction to physically connect the first substrate 100 and the contact area CA of the second substrate 290.

In an embodiment, the first substrate 100 and/or the second substrate 290 may be made of glass.

In this case, the bonding filament BF may be made of the same material as glass that forms the first substrate 100 and/or the second substrate 290.

In an embodiment, the width W_B of the bonding filament BF may be about 10 μm to about 300 μm. The width W_B of the bonding filament BF is significantly smaller than a width of a conventional sealing member (e.g., the frit seal FR) including frit. Therefore, if the frit is replaced with the bonding filament BF, the area of the non-display area NDA can be reduced. As a result, a display device having a narrow bezel can be realized.

In an embodiment, the bonding filament BF may include a central portion C and a peripheral portion P.

The peripheral portion P may surround the central portion C. That is, as illustrated in the cross-section of FIG. 7, the peripheral portion P may be disposed on both sides of the central portion C.

The bonding filament BF may be a result of melting and then recrystallizing the contact area CA of the second substrate 290 and a part of the first substrate 100. The melting of the contact area CA of the second substrate 290 and the part of the first substrate 100 may be performed by a femtosecond laser. This will be described in detail later.

In an embodiment, the peripheral portion P and the central portion C may be a result of hardening after melting at different temperatures. Accordingly, the peripheral portion P and the central portion C may have different refractive indices. That is, the peripheral portion P and the central portion C may have different optical characteristics. Thus, the peripheral portion P and the central portion C may be distinguished from each other.

In an embodiment, a width s1 of the central portion C may be about 20 μm to about 70 μm.

The bonding filament BF may directly and physically connect the first substrate 100 and the second substrate 290. Since the bonding filament BF is formed by melting a part of the first substrate 100 and a part of the second substrate 290, it may include the materials of the first substrate 100 and the second substrate 290. That is, the bonding filament BF may include a material in which the materials of the first substrate 100 and the second substrate 290 are mixed without any boundary or may include a recrystallized mixture of the materials of the first substrate 100 and the second substrate 290.

In an embodiment, the contact area CA of the second substrate 290 may contact an insulating film disposed on the first substrate 100. One or more insulating films may be disposed on the first substrate 100. In an embodiment, the insulating films may include a first insulating film ILD1, a second insulating film ILD2, and a third insulating film ILD3 stacked sequentially. Although three insulating films are stacked on the first substrate 100 in FIG. 7, this is merely an example, and the number of insulating films is not limited to three. That is, in an embodiment, the number of insulating films may be less than three or may be four or more. In an embodiment, the first insulating film ILD1 may be made of the same material as the buffer layer 210 of the display area DA. That is, the first insulating film ILD1 and the buffer layer 210 may be formed simultaneously in the same process. However, this is merely an example, and the method of forming the first insulating film ILD1 and the buffer layer 210 is not limited to this example.

In an embodiment, the second insulating film ILD2 may be made of the same material as the first insulating layer 220 of the display area DA. That is, the second insulating film ILD2 and the first insulating layer 220 may be formed simultaneously in the same process.

In an embodiment, the third insulating film ILD3 may be made of the same material as the second insulating layer 230 of the display area DA. That is, the third insulating film ILD3 and the second insulating layer 230 may be formed simultaneously in the same process.

In an embodiment, the bonding filament BF may grow from the first substrate 100 to pass through a plurality of insulating films. That is, the bonding filament BF may pass through the first insulating film ILD1, the second insulating film ILD2 and the third insulating film ILD3.

In an embodiment, the bonding filament BF may grow from the second substrate 290 to pass through a plurality of insulating films.

In this case, side surfaces of the bonding filament BF may contact at least one of the insulating films.

In addition, a region of the contact area CA excluding the region where the bonding filament BF is formed may contact the first substrate 100 or may contact the insulating films formed on the first substrate 100.

Figure 8:
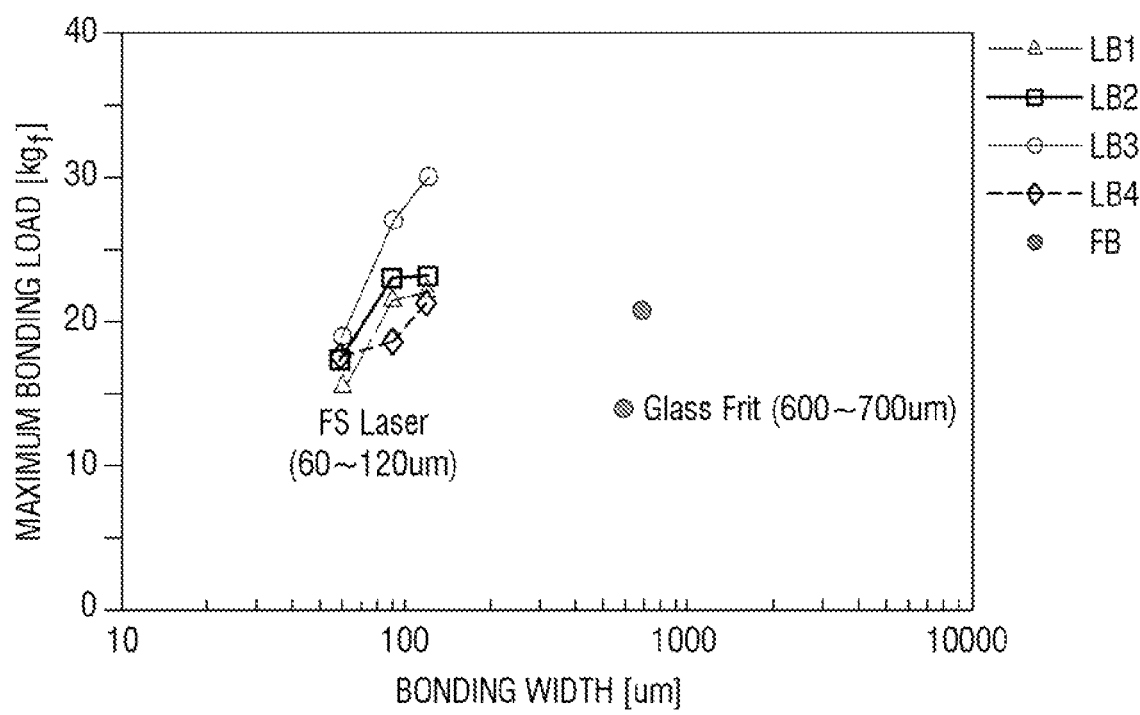
FIG. 8 is a graph illustrating the effect of the present disclosure.

FIG. 8 is a graph illustrating the effect of the present disclosure.

FIG. 8 illustrates strength and bonding width when two sheets of glass are bonded by first laser bonding LB1, second laser bonding LB2, third laser bonding LB3, fourth laser bonding LB4, and frit bonding FB.

In the first laser bonding LB1, the second laser bonding LB2, the third laser bonding LB3 and the fourth laser bonding LB4, two sheets of glass are bonded by forming a bonding filament between the two sheets of glass. The first laser bonding LB1, the second laser bonding LB2, the third laser bonding LB3 and the fourth laser bonding LB4 are different only in the type of the two sheets of glass and are the same in that the bonding filament is formed using a femtosecond laser.

Referring to FIG. 8, laser bonding that forms a bonding filament has a bonding width of $\frac{1}{5}^{th}$ of the conventional frit bonding FB and a bonding strength similar or superior to the conventional frit bonding FB. That is, when two sheets of glass are bonded by forming a bonding filament, it is possible to increase the bonding strength while reducing the area required for bonding (which affects the area of the non-display area NDA of the display device). Accordingly, a display device having a narrow bezel and excellent bonding strength can be realized.

Hereinafter, display devices according to other embodiments will be described. In the following embodiments, the same elements as those already described above will be indicated by the same reference numerals, and a redundant description of the same elements will be omitted or given briefly.

Figure 9:
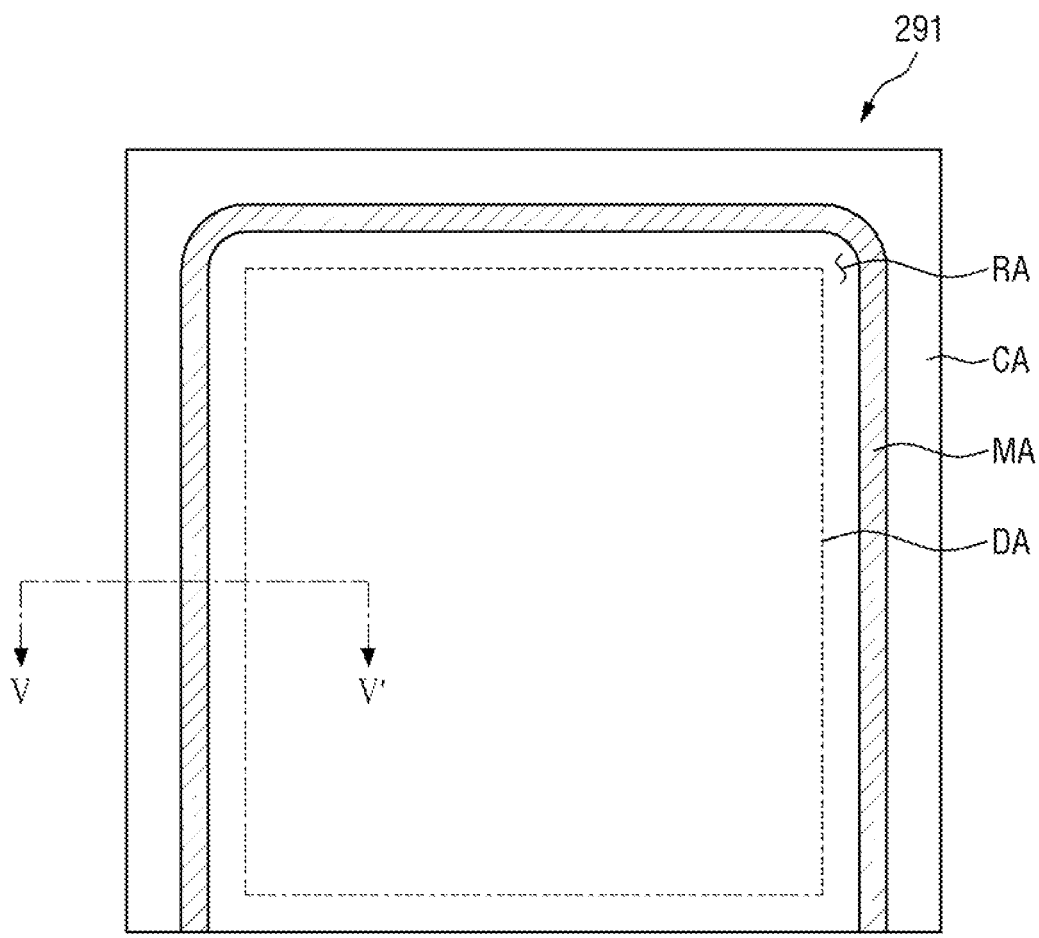
FIG. 9 is a partial plan view of a display device according to an embodiment.
Figure 10:
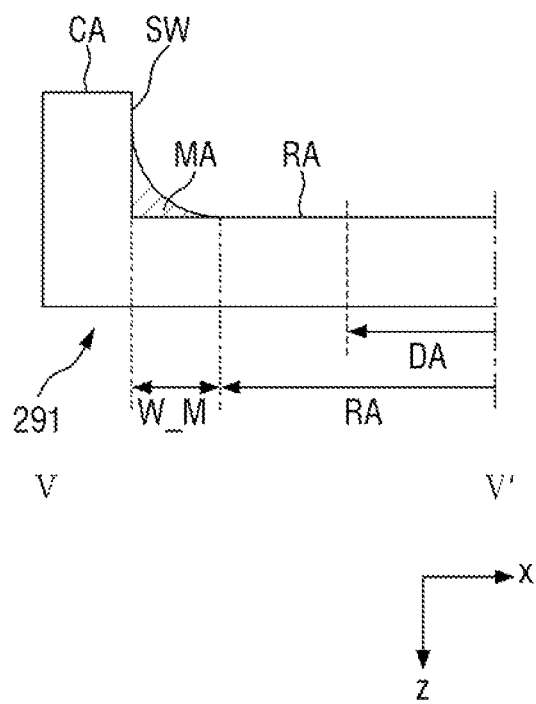
FIG. 10 is a cross-sectional view taken along line V-V' of FIG. 9.

FIG. 9 is a partial plan view of a display device according to an embodiment. FIG. 10 is a cross-sectional view taken along line V-V' of FIG. 9.

Referring to FIG. 9, a middle area MA may be further defined between a recessed area RA and a contact area CA of a second substrate 291 in an embodiment.

As described above, the recessed area RA and the contact area CA may be flat surfaces, but may be at different levels.

The middle area MA may be disposed between the recessed area RA and the contact area CA and may include at least partially inclined surfaces. That is, as illustrated in FIG. 9, the middle area MA may include inclined surfaces extending downward from inner sidewalls SW of the contact area CA to ends of the recessed area RA. Accordingly, a thickness of the second substrate 291 may gradually decrease from the contact area CA toward the recessed area RA.

In an embodiment, the recessed area RA may be obtained by partially etching the second substrate 291. In the etching process, a boundary between the recessed area RA and the contact area CA may be formed as a line as illustrated in FIG. 1 or may be formed as a plane as illustrated in FIG. 9. The boundary may be especially noticeable when the recessed area RA is formed by a chemical etching method. This is because the chemical etching method requires a certain margin in the etching process, and the middle area MA having an intermediate value of two levels is needed in order to form two planes having different levels (the contact area CA and the recessed area RA).

In an embodiment in which the contact area CA has a "U" shape in plan view, the middle area MA may also have a "U" shape along the contact area CA. In addition, the middle area MA may be a buffer area formed in the etching process and may have rounded corners.

Since the recessed area RA needs to cover a display area DA completely, it may basically have a quadrilateral shape. However, due to the presence of the middle area MA, corners of the recessed area RA may be rounded along the middle area MA in an embodiment.

In an embodiment, a width W_M of the middle area MA (defined as a distance between ends of the contact area CA and the ends of the recessed area RA) may be about 5 μm to about 30 μm.

Since the middle area MA has a thickness different from that of the recessed area RA, the middle area MA and the recessed area RA may have different refractive indices. In an embodiment, the refractive index of the middle area MA may be greater than that of the recessed area RA. Thus, the middle area MA can be distinguished from the recessed area RA.

Figure 11:
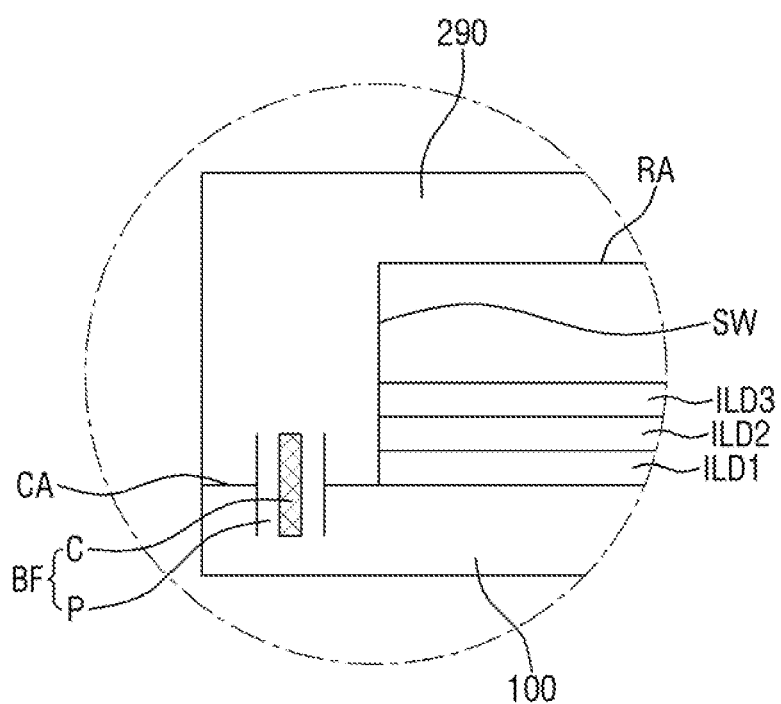
FIG. 11 is a partial cross-sectional view of a display device according to an embodiment.

FIG. 11 is a partial cross-sectional view of a display device according to an embodiment.

FIG. 11 is a modified example of FIG. 7. As described above, a contact area CA may directly contact a first substrate 100. Specifically, a region of the contact area CA excluding a region where a bonding filament BF is formed may directly contact the first substrate 100.

This structure may result from the process of partially removing an insulating film disposed on the first substrate 100 and then bringing a second substrate 290 into contact with the first substrate 100. That is, this structure can be obtained by completely removing an insulating film near ends of the first substrate 100 and then forming the bonding filament BF in a state where the contact area CA of the second substrate 290 is in direct contact with the first substrate 100. However, this is merely an example, and this structure is not necessarily obtained by the above process.

In an embodiment, inner sidewalls SW of the second substrate 290 may contact one or more of a first insulating film ILD1, a second insulating film ILD2 and a third insulating film ILD3.

In FIG. 11, the inner sidewalls SW of the second substrate 290 contact the first insulating film ILD1, the second insulating film ILD2, and the third insulating film ILD3. However, the present disclosure is not limited to this case. In an embodiment, the first insulating film ILD1, the second insulating film ILD2, and the third insulating film ILD3 may be spaced apart from the inner sidewalls SW.

When the region of the contact area CA excluding the region where the bonding filament BF is formed directly contacts the first substrate 100, the bonding performance of the first substrate 100 and the second substrate 290 can be improved. That is, if an insulating film is interposed between the contact area CA and the first substrate 100, it may increase a physical distance between the contact area CA and the first substrate 100, thereby deteriorating the bonding performance. However, this can be prevented in the embodiment of FIG. 11.

Figure 12:
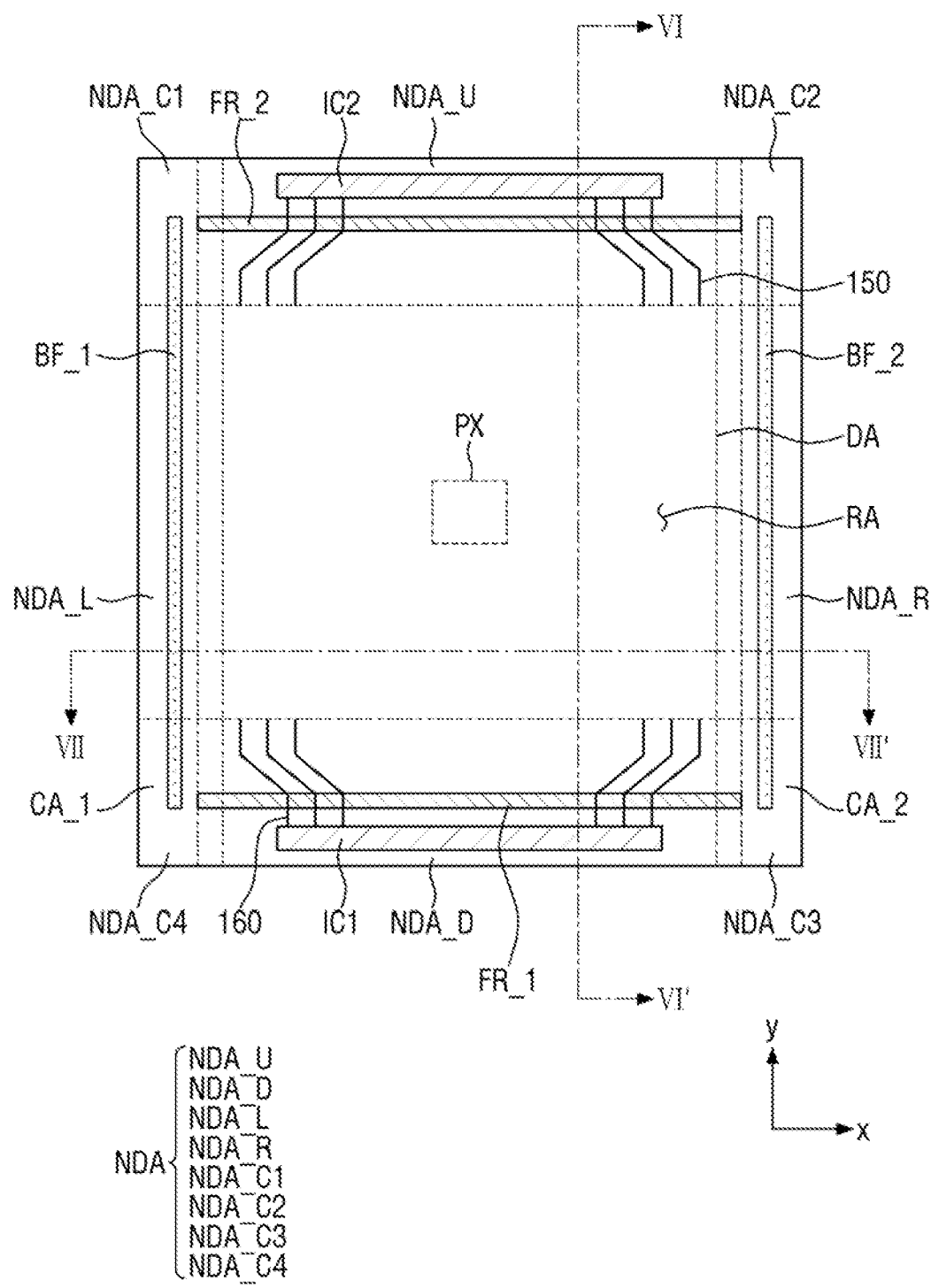
FIG. 12 is a layout view of a display device according to an embodiment.
Figure 13:
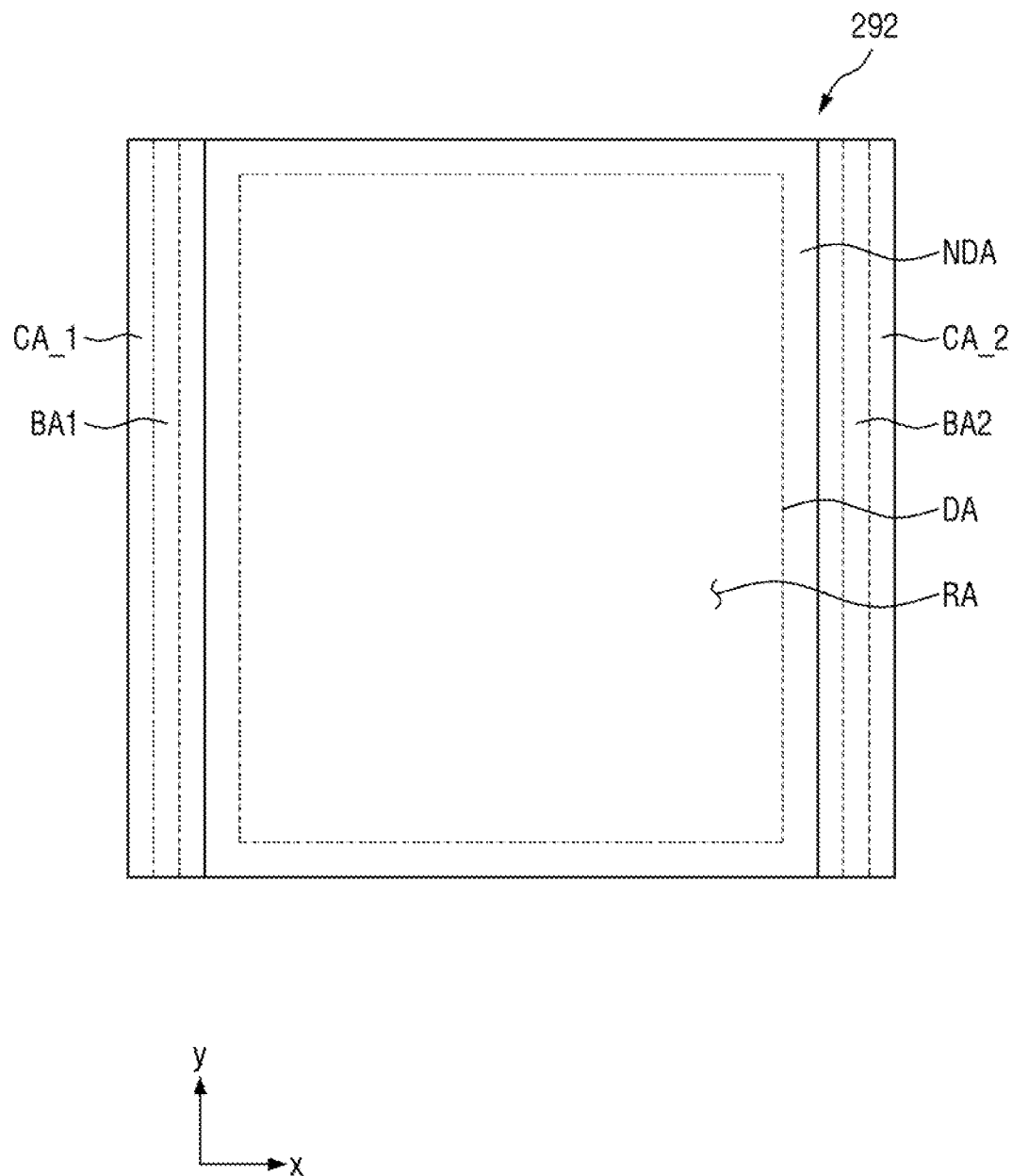
FIG. 13 is a partial plan view of the embodiment of FIG. 12.
Figure 14:
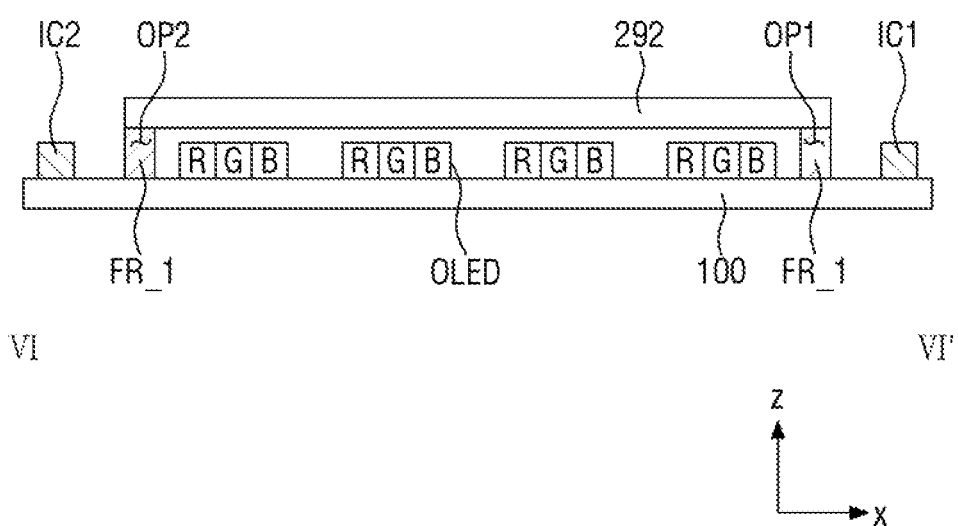
FIG. 14 is a cross-sectional view taken along line VI-VI' of FIG. 12.
Figure 15:
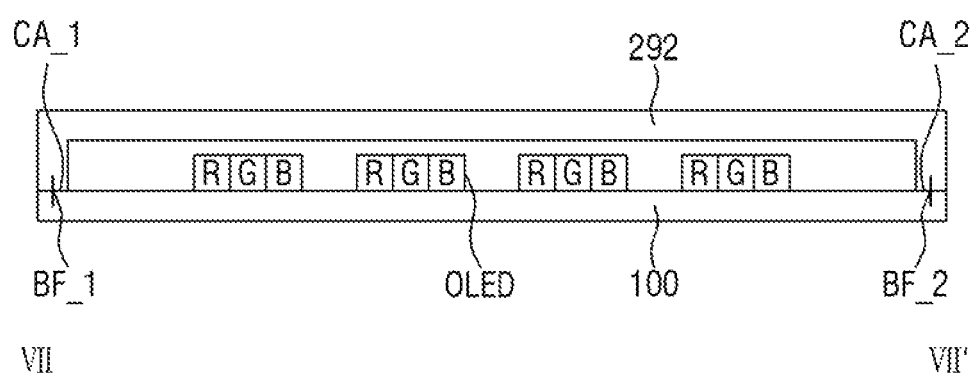
FIG. 15 is a cross-sectional view taken along line VII-VII' of FIG. 12.

FIG. 12 is a layout view of a display device according to an embodiment. FIG. 13 is a partial plan view of the embodiment of FIG. 12. FIG. 14 is a cross-sectional view taken along line VI-VI' of FIG. 12. FIG. 15 is a cross-sectional view taken along line VII-VII' of FIG. 12.

Referring to FIGS. 12 through 15, two driver integrated circuits IC may be disposed on a first substrate 100 in an embodiment. For ease of description, a driver integrated circuit disposed in a lower non-display area NDA_D will be referred to as a first driver integrated circuit IC1, and a driver integrated circuit disposed in an upper non-display area NDA_U will be referred to as a second driver integrated circuit IC2.

The first driver integrated circuit IC1 is substantially the same as the driver integrated circuit IC described above with reference to FIG. 1, etc., and thus a detailed description thereof is omitted.

As the number of images formed in a display area DA increases, it may be difficult to drive the display area DA using only one driver integrated circuit. In this case, an additional driver integrated circuit may be further disposed.

In an embodiment, the second driver integrated circuit IC2 may be placed to face the first driver integrated circuit IC1. That is, the display area DA may be disposed between the second driver integrated circuit IC2 and the first driver integrated circuit IC1.

The second driver integrated circuit IC2 may generate signals necessary for driving the display area DA and transmit the generated signals to the display area DA. To this end, a plurality of second conductive lines 150 may be disposed between the second driver integrated circuit IC2 and the display area DA. The second conductive lines 150 may be disposed between the second driver integrated circuit IC2 and the display area DA to transmit signals generated by the second driver integrated circuit IC2 to the display area DA.

In an embodiment, a frit seal FR may include a first sub-frit seal FR_1 and a second sub-frit seal FR_2.

Each of the first sub-frit seal FR_1 and the second sub-frit seal FR_2 may have a bar shape extending in a longitudinal direction. In an embodiment, the longitudinal direction may be an x-axis direction of FIG. 12. Therefore, the first sub-frit seal FR_1 and the second sub-frit seal FR_2 may extend parallel to each other.

In an embodiment, the first sub-frit seal FR_1 may be disposed in the lower non-display area NDA_D. Specifically, the first sub-frit seal FR_1 may be disposed between the display area DA and the first driver integrated circuit IC1. Accordingly, the first sub-frit seal FR_1 may at least partially overlap a plurality of first conductive lines 160.

In an embodiment, the second sub-frit seal FR_2 may be disposed in the upper non-display area NDA_U. Specifically, the second sub-frit seal FR_2 may be disposed between the display area DA and the second driver integrated circuit IC2. Accordingly, the second sub-frit seal FR_2 may at least partially overlap the second conductive lines 150.

In an embodiment, a bonding filament BF may include a first sub-bonding filament BF_1 and a second sub-bonding filament BF_2.

Each of the first sub-bonding filament BF_1 and the second sub-bonding filament BF_1 may have a bar shape extending in the longitudinal direction. In an embodiment, the longitudinal direction may be a y-axis direction of FIG. 12.

In an embodiment, the first sub-bonding filament BF_1 may be disposed in a left non-display area NDA_L. Alternatively, both ends of the first sub-bonding filament BF_1 may extend to a first corner non-display area NDA_C1 or a fourth corner non-display area NDA_C4.

In an embodiment, the second sub-bonding filament BF_2 may be disposed in a right non-display area NDA_R. Alternatively, both ends of the second sub-bonding filament BF_2 may extend to a second corner non-display area NDA_C2 or a third corner non-display area NDA_C3.

The first sub-bonding filament BF_1 and the second sub-bonding filament BF_2 may be disposed between a contact area CA and the first substrate 100.

In an embodiment, the contact area CA of a second substrate 292 may include a first sub-contact area CA_1 and a second sub-contact area CA_2.

The contact area CA will now be described with reference to FIG. 13.

Each of the first sub-contact area CA_1 and the second sub-contact area CA_2 may have a bar shape extending in the longitudinal direction. In an embodiment, the longitudinal direction may be the y-axis direction of FIGS. 12 and 13.

The first sub-contact area CA_1 and the second sub-contact area CA_2 may extend parallel to each other, but may be spaced apart from each other by a predetermined distance.

A recessed area RA may be disposed between the first sub-contact area CA_1 and the second sub-contact area CA_2. Although not illustrated in FIG. 13, a middle area may be disposed between the first sub-contact area CA_1 and the recessed area RA and/or between the second sub-contact area CA_2 and the recessed area RA, as described above with reference to FIG. 9.

The first sub-contact area CA_1 and the second sub-contact area CA_2 may contact the first substrate 100. The first sub-bonding filament BF_1 may be disposed between the first sub-contact area CA_1 and the first substrate 100, and the second sub-bonding filament BF_2 may be disposed between the second sub-contact area CA_1 and the first substrate 100.

That is, the display area DA may be encapsulated by the first sub-bonding filament BF_1, the second sub-bonding filament BF_2, the first sub-frit seal FR_1 and the second sub-frit seal FR_2 arranged to surround the display area DA.

Referring to FIG. 14, upper and lower sides of the display area DA may be encapsulated by the first sub-frit seal FR_1 and the second sub-frit seal FR_2. When the first sub-contact area CA_1 and the second sub-contact area CA_2 are arranged side by side in the form of "11" as described above with reference to FIG. 13, a first opening OP1 and a second opening OP2 may be formed between both ends of the recessed area RA and the first substrate 100. The first opening OP1 may be disposed adjacent to the first driver integrated circuit IC1, and the second opening OP2 may be disposed adjacent to the second driver integrated circuit IC2.

The first sub-frit seal FR_1 and the second sub-frit seal FR_2 may seal the first opening OP1 and the second opening OP2. Specifically, the first sub-frit seal FR_1 may seal the first opening OP1, and the second sub-frit seal FR_2 may seal the second opening OP2. Accordingly, the upper and lower sides of the display area DA may be sealed by the first sub-frit seal FR_1 and the second sub-frit seal FR_2.

Referring to FIG. 15, left and right sides of the display area DA may be sealed by the first sub-bonding filament BF_1 and the second sub-bonding filament BF_2.

That is, both ends of the second substrate 292 may be bent, and the first sub-contact area CA_1 and the second sub-contact area CA_2, which are the bent ends of the second substrate 292, may contact the first substrate 100.

The first sub-bonding filament BF_1 may be disposed between the first sub-contact area CA_1 and the first substrate 100, and the second sub-bonding filament BF_2 may be disposed between the second sub-contact area CA_2 and the first substrate 100.

The cross-sectional structures of the first sub-bonding filament BF_1 and the second sub-bonding filament BF_2 may be substantially the same as that described above with reference to FIG. 7.

That is, each of the first sub-bonding filament BF_1 and the second sub-bonding filament BF_2 may include a central portion C and a peripheral portion P and contain both the material of the first substrate 100 and the material of the second substrate 292. That is, each of the first sub-bonding filament BF_1 and the second sub-bonding filament BF_2 may include a mixture of the materials of the first substrate 100 and the second substrate 292 or a recrystallized mixture of the materials of the first substrate 100 and the second substrate 292.

The first sub-bonding filament BF_1, the second sub-bonding filament BF_2, the first sub-frit seal FR_1 and the second sub-frit seal FR_2 may constitute a cell seal CS as described above. The cell seal CS may surround the display area DA and encapsulate the display area DA. Accordingly, the introduction of moisture, oxygen, or foreign matter into the display area DA can be prevented.

Figure 16:
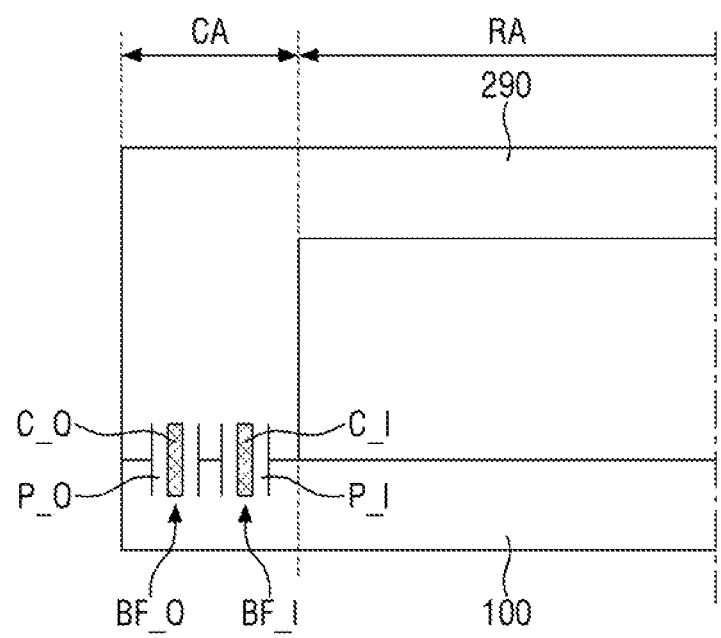
FIG. 16 is a partial cross-sectional view of a display device according to an embodiment.

FIG. 16 is a partial cross-sectional view of a display device according to an embodiment. Referring to FIG. 16, in an embodiment, a bonding filament may include at least two sub-bonding filaments extending parallel to each other.

For ease of description, in FIG. 16, a bonding filament disposed on an inner side will be referred to as an inner bonding filament BF_I, and a bonding filament disposed outside the inner bonding filament BF_I will be referred to as an outer bonding filament BF_O.

In an embodiment, the inner bonding filament BF_I may be disposed closer to a recessed area RA than the outer bonding filament BF_O. That is, the outer bonding filament BF_O may surround the inner bonding filament BF_I.

In an embodiment, the inner bonding filament BF_I and the outer bonding filament BF_O may be spaced apart from each other. The inner bonding filament BF_I and the outer bonding filament BF_O spaced apart from each other may extend in the same direction.

That is, when the inner bonding filament BF_I extends along an x-axis or a y-axis, the outer bonding filament BF_O may extend along the inner bonding filament BF_I in a x-axis or y-axis direction (in top view).

In an embodiment, the inner bonding filament BF_I may include a central portion C_I and a peripheral portion P_I disposed outside the central portion C_I. The central portion C_I and the peripheral portion P_I may be the same as those of the bonding filaments BF described above in the display devices according to the embodiments.

The outer bonding filament BF_O may also include a central portion C_O and a peripheral portion P_O. The central portion C_O and the peripheral portion P_O may be the same as those of the bonding filaments BF described above in the display devices according to the embodiments.

That is, when the inner bonding filament BF_I and the outer bonding filament BF_O are spaced apart from each other, the two central portions C_I and C_O may be visible between a contact area CA and a first substrate 100.

When a plurality of bonding filaments are formed between the contact area CA and the first substrate 100 as described above, the first substrate 100 and a second substrate 290 can be more stably bonded together. That is, the bonding strength between the first substrate 100 and the second substrate 290 can be increased.

In an embodiment, the inner bonding filament BF_I and the outer bonding filament BF_O may at least partially overlap each other. That is, the peripheral portion P_I of the inner bonding filament BF_I and the peripheral portion P_O of the outer bonding filament BF_O may at least partially overlap each other. Even in this case, the central portion C_I of the inner bonding filament BF_I and the central portion C_O of the outer bonding filament BF_O may be spaced apart from each other and may be visible in cross-section.

In an embodiment, the inner bonding filament BF_I and the outer bonding filament BF_O may be closer to each other. In this case, the central portion C_I of the inner bonding filament BF_I and the central portion C_O of the outer bonding filament BF_O may partially overlap each other. When the central portion C_I of the inner bonding filament BF_I and the central portion C_O of the outer bonding filament BF_O partially overlap each other, only one central portion may be visible in cross-section.

Figure 17:
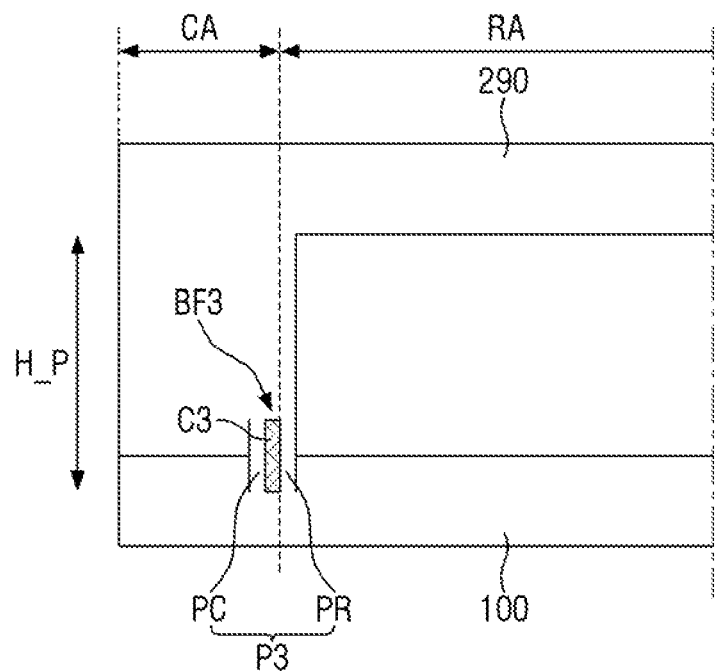
FIG. 17 is a partial cross-sectional view of a display device according to an embodiment.

FIG. 17 is a partial cross-sectional view of a display device according to an embodiment. Referring to FIG. 17, in an embodiment, a part of a bonding filament BF3 may connect a recessed area RA and a surface of a first substrate 100.

As will be described in detail later, the bonding filament BF3 may be formed by irradiating a femtosecond laser beam while focusing the femtosecond laser beam on a contact area CA of a second substrate 290 or the first substrate 100. The bonding filament BF3 may grow between interfaces that are in contact with each other or may connect surfaces that are spaced apart by a predetermined distance.

That is, a part of the bonding filament BF3 may connect the contact area CA and the first substrate 100, and the remaining part of the bonding filament BF3 may connect the recessed area RA adjacent to the contact area CA and the first substrate 100.

In FIG. 17, a peripheral portion P3 disposed outside a central portion C3 includes a first sub-peripheral portion PC and a second sub-peripheral portion PR.

In an embodiment, the first sub-peripheral portion PC may connect the contact area CA and the first substrate 100, and the second sub-peripheral portion PR may connect the recessed area RA and the first substrate 100.

In this case, a height H_P of the second sub-peripheral portion PR may be greater than or equal to a distance between a surface of the recessed area RA and a surface of the first substrate 100.

While a case where the peripheral portion P3 connects the first substrate 100 and the recessed area RA is illustrated in FIG. 17, the present disclosure is not limited to this case. In an embodiment, at least a part of the central portion C3 may connect the first substrate 100 and the recessed area RA.

In FIGS. 16 and 17, no insulating film is illustrated for ease of description. However, the cases of FIGS. 16 and 17 may also include an insulating film structure as described above with reference to FIGS. 7 and 11.

Hereinafter, methods of manufacturing a display device according to embodiments will be described.

Some of the elements described below may be substantially the same as those of the display devices according to the above-described embodiments, and thus a description thereof will be omitted in order to avoid redundancy.

Figure 18:
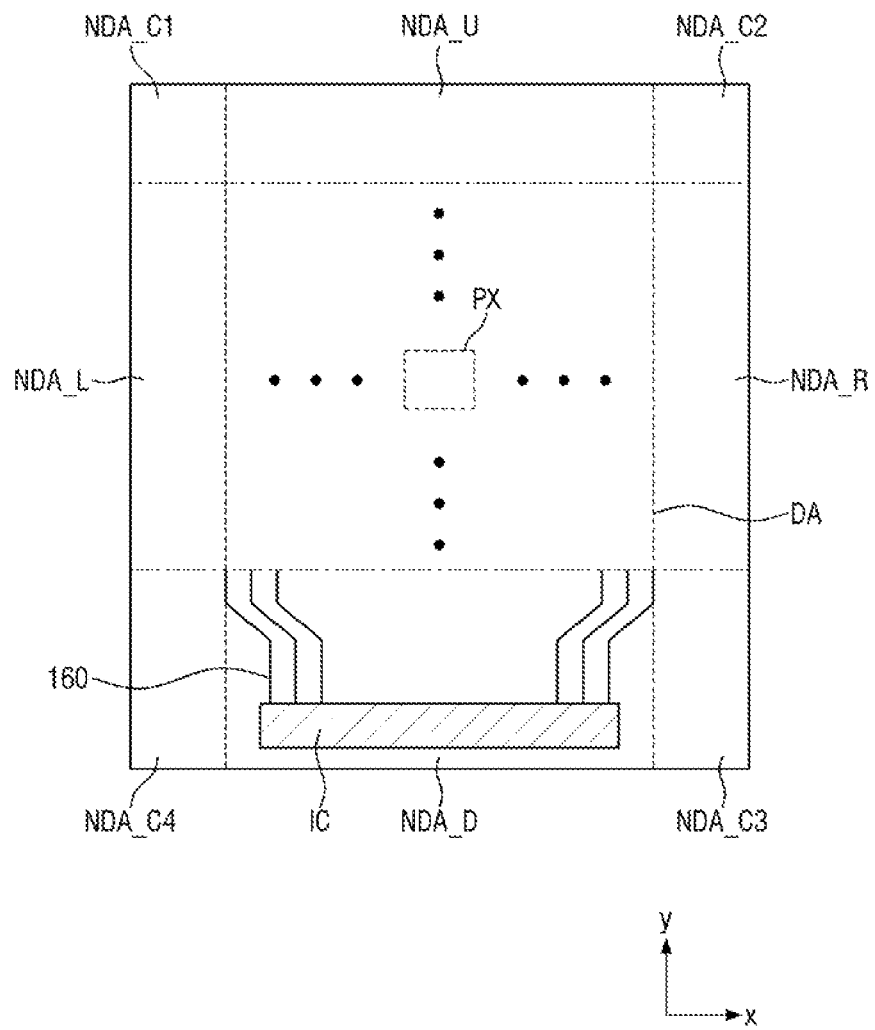
FIG. 18 is a layout view for explaining a method of manufacturing a display device according to an embodiment.
Figure 19:
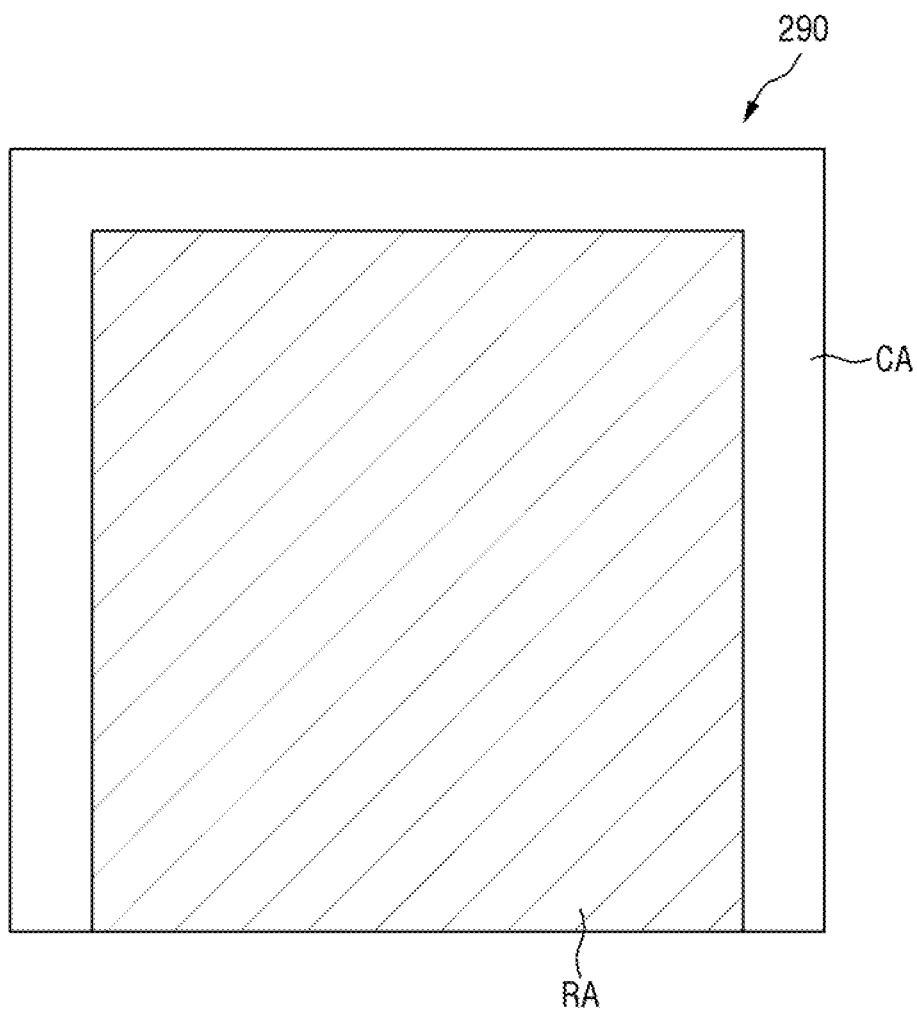
FIG. 19 is a partial plan view of a display device according to an embodiment.
Figure 20:
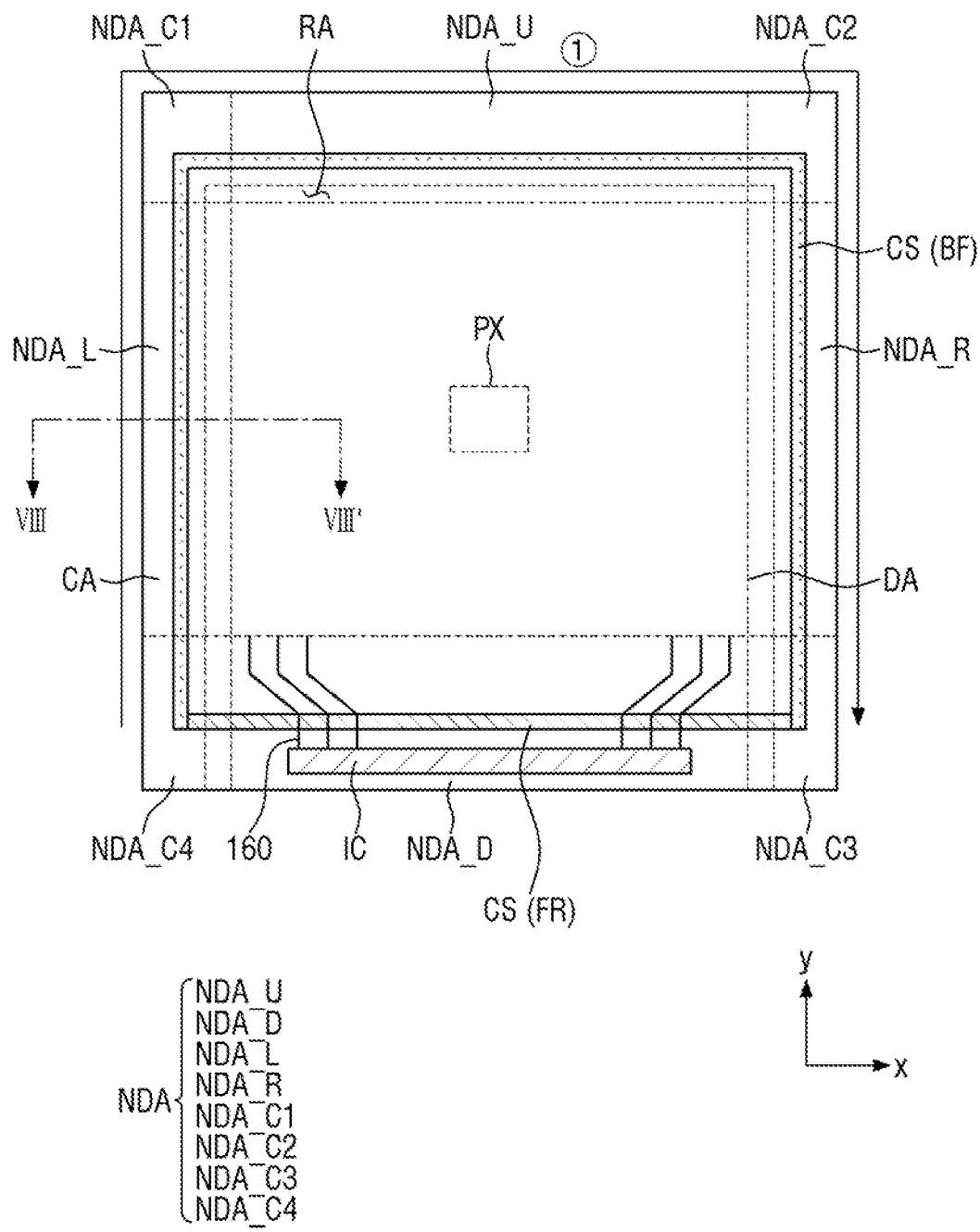
FIG. 20 is a layout view for explaining the method of manufacturing a display device according to the embodiment.
Figure 21:
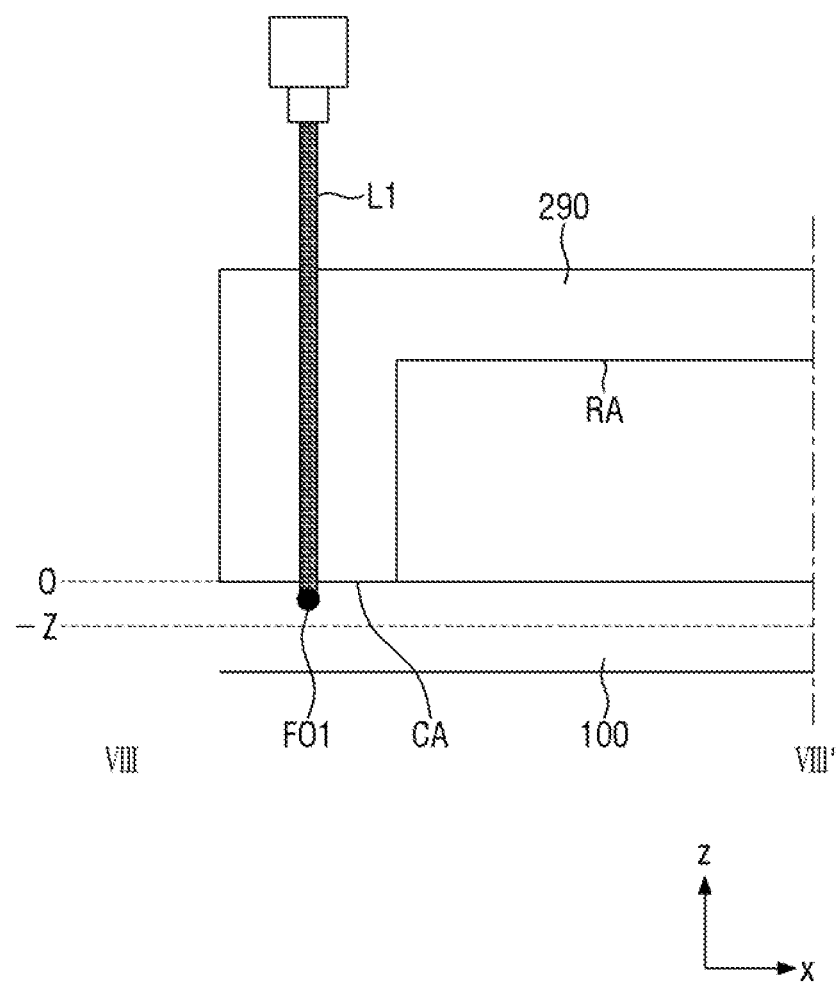
FIG. 21 is a cross-sectional view taken along line VIII-VIII' of FIG. 20.

FIG. 18 is a layout view for explaining a method of manufacturing a display device according to an embodiment. FIG. 19 is a partial plan view of a display device according to an embodiment. FIG. 20 is a layout view for explaining the method of manufacturing a display device according to the embodiment. FIG. 21 is a cross-sectional view taken along line VIII-VIII' of FIG. 20.

Referring to FIGS. 18 through 21, the method of manufacturing a display device according to the embodiment includes preparing a first substrate 100 in which a display area DA and a non-display area NDA disposed outside the display area DA are defined and a second substrate 290 which faces the first substrate 100; applying a frit F1 onto the first substrate 100 or the second substrate 290 to overlap the non-display area NDA of the first substrate 100; forming a recessed area RA and a contact area CA by recessing a part of the second substrate 290 in a thickness direction; forming a bonding filament BF for connecting the contact area CA and the first substrate 100 by irradiating a laser beam in a state where the contact area CA and the first substrate 100 are in contact with each other; and forming a frit seal FR by curing the frit F1.

FIG. 18 illustrates the first substrate 100. The first substrate 100 may be substantially the same as those of the display devices according to the above-described embodiments. That is, a plurality of pixels, each including an organic light emitting diode OLED, may be disposed in the display area DA, and the non-display area NDA may be divided into an upper non-display area NDA_U, a lower non-display area NDA_D, a left non-display area NDA_L, a right non-display area NDA_R, and first through fourth corner non-display areas NDA_C1 through NDA_C4.

The second substrate 290 may face the first substrate 100. The second substrate 290 may be substantially the same as those of the display devices according to the above-described embodiments.

Next, the frit F1 may be applied onto the first substrate 100 or the second substrate 290 to overlap the non-display area NDA of the first substrate 100.

In an embodiment, the frit F1 may be applied onto the first substrate 100 or the second substrate 290. As illustrated in FIG. 20, the applied frit F1 may be disposed in the lower non-display area NDA_D in a state where the first substrate 100 and the second substrate 290 are stacked on each other. That is, the frit F1 may be applied to be disposed between a driver integrated circuit IC and the display area DA and to at least partially overlap a plurality of first conductive lines 160. The frit F1 may be in the form of a dough containing glass powder. The frit F1 may later be cured into the frit seal FR.

In an embodiment, the applied frit F1 may be placed to overlap the lower non-display area NDA_D in a state where the first substrate 100 and the second substrate 290 are stacked on each other. In addition, both ends of the frit F1 may extend to the third corner non-display area NDA_C3 and/or the fourth corner non-display area NDA_C4.

Alternatively, when a display device includes two driver integrated circuits as illustrated in FIG. 12, the frit F1 may also be placed in the upper non-display area NDA_U.

Next, referring to FIG. 19, a part of the second substrate 290 may be recessed in the thickness direction to form the recessed area RA and the contact area CA. In an embodiment, a part of the second substrate 290 may be recessed by a wet etching method. In an embodiment, a part of the second substrate 290 may be recessed by a drying etching method or cut mechanically to form the recessed area RA.

The contact area CA may be disposed outside the recessed area RA. That is, the contact area CA may be defined as a non-recessed area.

The contact area CA may cover three sides of the recessed area RA as illustrated in FIG. 3 or may be disposed in the form of "11" with the recessed area RA interposed between parts of the contact area CA as illustrated in FIG. 13.

In addition, at this stage, a middle area MA may be formed between the contact area CA and the recessed area RA as illustrated in FIG. 9.

Next, referring to FIGS. 20 and 21, the bonding filament BF for connecting the contact area CA and the first substrate 100 may be formed by irradiating a laser beam in a state where the contact area CA and the first substrate 100 are in contact with each other.

The second substrate 290 may be placed to face the first substrate 100. Accordingly, the display area DA may be completely overlapped by the recessed area RA of the second substrate 290.

The contact area CA may contact the non-display region NDA of the first substrate 100.

That is, the contact area CA may directly contact the first substrate 100 or may contact an insulating film formed on the first substrate 100.

In an embodiment, the bonding filament BF may be formed between the first substrate 100 and the contact area CA by irradiating a laser beam.

In an embodiment, the laser beam may be a femtosecond laser beam. In the present specification, the femtosecond laser beam may denote a laser beam having a pulse width of about 200 femtoseconds to about 500 femtoseconds.

In an embodiment, a laser beam L1 may be irradiated continuously. That is, the laser beam L1 may be continuously irradiated along the contact area CA as illustrated in FIG. 20. In an embodiment in which the contact area CA is formed over the left non-display area NDA_L, the upper non-display area NDA_U and the right non-display area NDA_R (in top view), the laser beam L1 may be irradiated along the left non-display area NDA_L, the upper non-display area NDA_U, and the right non-display area NDA_R (see ① in FIG. 20).

Referring to FIG. 21, the laser beam L1 may be irradiated from above the second substrate 290 toward the first substrate 100. In an embodiment, a focus FO1 of the laser beam L1 may be set inside the first substrate 100.

For ease of description, references of the depth of focus will be set. An upper surface of the first substrate 100 may be defined as a point where the depth of focus is "zero." In addition, the depth of focus at a point inside the first substrate 100 which is at a distance z from the upper surface of the first substrate 100 may be defined as $-z$.

In an embodiment, the depth of focus of the laser beam L1 may be about $-100$ μm to less than about 0 μm. When the laser beam L1 is irradiated, high energy may be provided around the focus FO1. The provided energy may turn a part of the first substrate 100 and a part of the contact area CA of the second substrate 290 into a plasma state. In other words, the part of the first substrate 100 and a part of the contact area CA of the second substrate 290 are plasmarized by the provided energy. The part of the first substrate 100 and the part of the second substrate 290 in the plasma state may be melted and recrystallized in a state where they are mixed with each other. In this process, a central portion C of the bonding filament BF may be formed (see FIG. 7).

Heat may be generated around the central portion C in the plasma state and may melt a portion around the central portion C. Accordingly, a peripheral portion P of the bonding filament BF may be formed to surround the central portion C. The central portion C and the peripheral portion P may grow around the focus FO1 in a z-axis direction. The peripheral portion P and the central portion C of the bonding filament BF may connect the first substrate 100 and the second substrate 290.

In FIG. 21, the contact area CA and the first substrate 100 are in contact with each other. However, the present disclosure is not limited to this case. In an embodiment, the bonding filament BF may grow in the z-axis direction to connect the first substrate 100 and the contact area CA even when the contact area CA and the first substrate 100 are spaced apart from each other by a predetermined distance (by an insulating film). In addition, the bonding filament BF3 may connect the recessed area RA and the first substrate 100 by overcoming a gap between a part of the recessed area RA and the first substrate 100 as in the embodiment of FIG. 20.

Since melting temperatures of the peripheral portion P and the central portion C are different, optical characteristics of the peripheral portion P and the central portion may be different. For example, refractive indices of the peripheral portion P and the central portion C may be different from each other. Therefore, the peripheral portion P and the central portion C can be distinguished from each other.

Next, the frit seal FR may be formed by curing the frit F1. The curing of the frit F1 may be achieved by general laser irradiation or infrared irradiation, not femtosecond laser irradiation.

When a laser beam is irradiated to the frit F1, the frit F1 may be at least partially melted to form the frit seal FR having bonding performance. The disposition of the frit seal FR may be substantially the same as those in the display devices according to the above-described embodiments, and thus a detailed description thereof is omitted.

A process temperature for forming a bonding filament is relatively high compared to a process temperature for forming a frit seal. That is, when a filament is formed in a portion where conductive lines are disposed, the conductive lines can be damaged by high temperature. Thus, by using the frit seal in the portion overlapping the conductive lines and using the bonding filament in the remaining portion, it is possible to realize a narrow bezel and prevent the damage to the conductive lines due to heat.

While a case where the bonding filament BF is formed before the frit seal FR has been described for case of description, the present disclosure is not limited to this order. That is, in an embodiment, the frit seal FR may be formed before the bonding filament BF.

The method of manufacturing a display device according to the embodiment may include partially removing an insulating film formed on the first substrate 100 before bringing the contact area CA and the first substrate 100 into contact with each other (see FIG. 11).

As described above with reference to FIGS. 7 and 11, one or more insulating films may be disposed on the first substrate 100. In an embodiment, the insulating films disposed on the first substrate 100 may be partially removed to expose the first substrate 100. The contact area CA may contact an area of the substrate 100 exposed by the removing of the insulating films. That is, when the insulating films are removed, the first substrate 100 may directly contact the contact area CA.

In an embodiment, the removing of the insulating films may be omitted. In this case, the bonding filament BF may pass through the insulating films as illustrated in FIG. 7.

A method of manufacturing a display device according to an embodiment will now be described.

Figure 22:
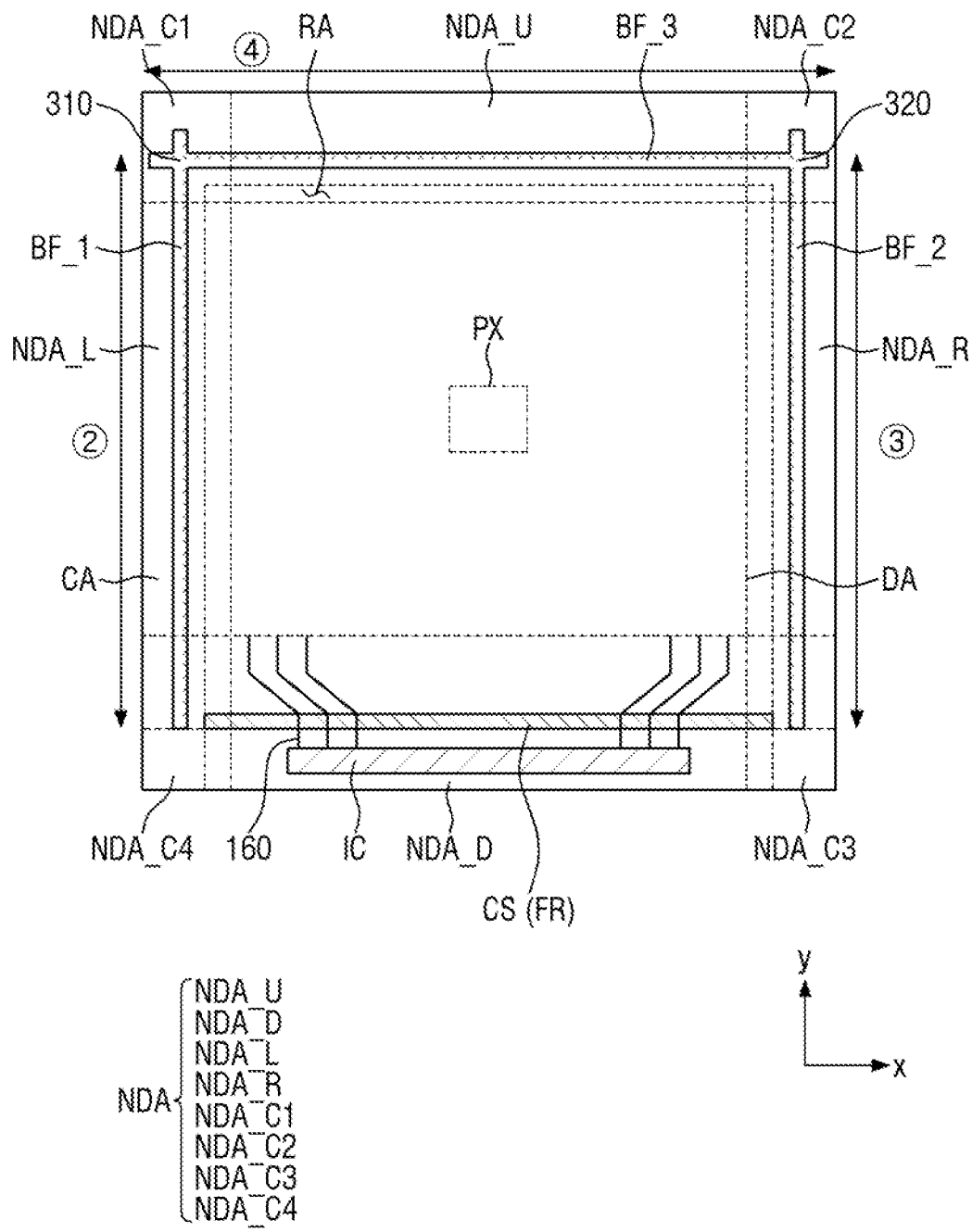
FIG. 22 is a layout view for explaining a method of manufacturing a display device according to an embodiment.

FIG. 22 is a layout view for explaining a method of manufacturing a display device according to an embodiment.

Referring to FIG. 22, a bonding filament BF for connecting a contact area CA and a first substrate 100 may be formed by irradiating a laser beam in a state where the contact area CA and the first substrate 100 are in contact with each other. In this operation, the laser beam may be irradiated intermittently.

Specifically, a first sub-bonding filament BF_1 and a second sub-bonding filament BF_2 may be formed by irradiating a laser beam in a y-axis direction. In an embodiment, the first sub-bonding filament BF_1 may be formed between the contact area CA and a left non-display area NDA_L, and the second sub-bonding filament BF_2 may be formed between the contact area CA and a right non-display area NDA_R (see ② and ③ in FIG. 22).

In an embodiment in which the contact area CA includes a first sub-contact area CA_1 and a second sub-contact area CA_2 as illustrated in FIG. 12, a laser beam may also be irradiated in the y-axis direction to form the first sub-bonding filament BF_1 and the second sub-bonding filament BF_2.

Then, a third sub-filament BF_3 may be formed by irradiating a laser beam in an x-axis direction.

The third sub-bonding filament BF_3 may be formed over an upper non-display area NDA_U.

In an embodiment, the third sub-bonding filament BF_3 may intersect the first sub-bonding filament BF_1 and the second sub-bonding filament BF_2.

The forming of the third sub-bonding filament BF_3 may be omitted in the embodiment in which the contact area CA includes the first sub-contact area CA_1 and the second sub-contact area CA_2 as illustrated in FIG. 12.

Accordingly, a first intersection point 310 may be formed in a first corner non-display area NDA_C1, and a second intersection point 320 may be formed in a second corner non-display area NDA_C2.

Figure 23:
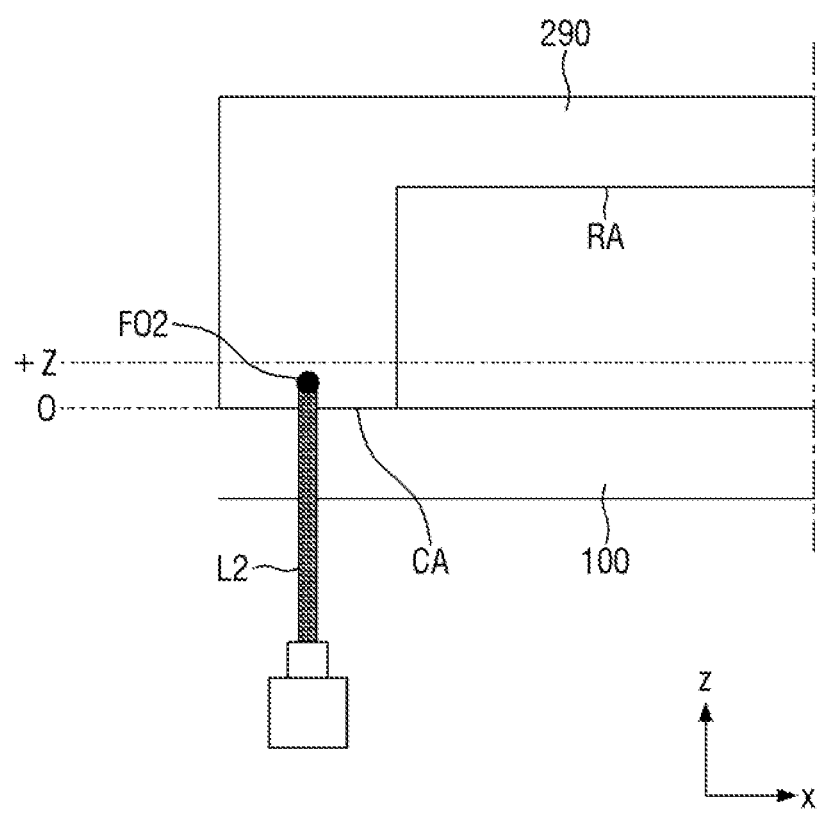
FIG. 23 is a cross-sectional view for explaining a method of manufacturing a display device according to an embodiment.

FIG. 23 is a cross-sectional view for explaining a method of manufacturing a display device according to an embodiment.

Referring to FIG. 23, unlike FIG. 21, a laser beam L2 may be irradiated from under a first substrate 100. The laser beam L2 may be irradiated from under the first substrate 100 toward a second substrate 290. In an embodiment, a focus FO2 of the laser beam L2 may be set inside the second substrate 290.

For ease of description, references of the depth of focus will be set. A surface of a contact area CA of the second substrate 290 may be defined as a point where the depth of focus is "zero." In addition, the depth of focus at a point inside the second substrate 290 which is at a distance z from the surface of the contact area CA may be defined as +z.

In an embodiment, the depth of focus of the laser beam L2 may be about 0 μm to less than about 100 μm. When the laser beam L2 is irradiated, high energy may be provided around the focus FO2. The provided energy may turn a part of the first substrate 100 and a part of the contact area CA of the second substrate 290 into a plasma state. The part of the first substrate 100 and the part of the second substrate 290 in the plasma state may be melted and recrystallized in a state where they are mixed with each other. In this process, a central portion C of a bonding filament BF may be formed (see FIG. 7).

According to embodiments, the area occupied by a cell seal can be reduced. Therefore, a display device having a narrow bezel can be realized.

In addition, a display device having improved bonding strength between an upper substrate and a lower substrate can be realized.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation. The above and other effects of the embodiments will become more apparent to one of daily skill in the art to which the embodiments pertain by referencing the claims.

The invention claimed is:

1. A display device comprising:
   a first substrate in which a display area and a non-display area disposed outside the display area are defined;
   a second substrate which faces the first substrate and comprises an area recessed in a thickness direction and a contact area disposed outside the recessed area; and
   a cell seal which bonds the first substrate and the second substrate together,
   wherein the cell seal comprises a bonding filament which is disposed between the contact area and the non-display area to connect the contact area and the first substrate and a frit seal which is disposed between the recessed area and the non-display area.

2. The display device of claim 1, further comprising a first driver integrated circuit which is disposed in the non-display area, wherein the frit seal is disposed between the display area and the first driver integrated circuit.

3. The display device of claim 1, wherein the contact area has a width of about 50 μm to about 300 μm.

4. The display device of claim 3, wherein the bonding filament at least partially overlaps the contact area.

5. The display device of claim 4, wherein the bonding filament has a width of about 10 μm to about 300 μm.

6. The display device of claim 1, wherein the second substrate further comprises inner sidewalls which connect the recessed area and the contact area, wherein an opening is defined by the inner sidewalls, the recessed area and the first substrate, and the frit seal fills the opening.

7. The display device of claim 1, further comprising a middle area which is disposed between the recessed area and the contact area and has a different refractive index from that of the recessed area.

8. The display device of claim 7, wherein the middle area has a width of about 5 μm to about 30 μm.

9. The display device of claim 1, wherein the non-display area comprises an upper non-display area disposed on an upper side of the display area, a lower non-display area disposed on a lower side of the display area, a left non display area disposed on a left side of the display area, and a right non-display area disposed on a right side of the display area.

10. The display device of claim 9, wherein the bonding filament is disposed over the upper non-display area, the left non-display area and the right non-display area, and the frit seal is disposed in the lower non-display area.

11. The display device of claim 1, wherein the bonding filament comprises a central portion and a peripheral portion disposed outside the central portion, wherein the central portion and the peripheral portion have different refractive indices.

12. The display device of claim 1, wherein a distance from a surface of the contact area to a surface of the recessed area is greater than or equal to a height of an organic light emitting diode.

13. A method of manufacturing a display device, the method comprising:
   preparing a first substrate in which a display area and a non-display area disposed outside the display area are defined and a second substrate which faces the first substrate;
   applying a frit onto the first substrate or the second substrate to overlap the non-display area of the first substrate;
   forming a recessed area and a contact area disposed outside the recessed area by recessing a part of the second substrate in a thickness direction;
   forming a bonding filament for connecting the contact area and the first substrate by irradiating a laser beam in a state where the contact area and the first substrate are in contact with each other; and
   forming a frit seal by curing the frit.

14. The method of claim 13, wherein the laser beam is a femtosecond laser beam having a pulse width of about 200 femtoseconds to about 500 femtoseconds.

15. The method of claim 13, wherein a focus of the laser beam is set inside the first substrate, and a depth of focus is about −100 μm to less than about 0 μm.

16. The method of claim 13, wherein one or more insulating films are formed on the first substrate and further comprising removing the insulating films, wherein the contact area contacts a part of the first substrate from which the insulating films have been removed.

\* \* \* \* \*